United States Patent
Gu et al.

(10) Patent No.: US 9,418,877 B2
(45) Date of Patent: Aug. 16, 2016

(54) INTEGRATED DEVICE COMPRISING HIGH DENSITY INTERCONNECTS IN INORGANIC LAYERS AND REDISTRIBUTION LAYERS IN ORGANIC LAYERS

(71) Applicant: QUALCOMM Incorporated, San Diego, CA (US)

(72) Inventors: Shiqun Gu, San Diego, CA (US); Ratibor Radojcic, San Diego, CA (US); Dong Wook Kim, San Diego, CA (US); Jae Sik Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 65 days.

(21) Appl. No.: 14/324,136

(22) Filed: Jul. 4, 2014

(65) Prior Publication Data
US 2015/0318262 A1 Nov. 5, 2015

Related U.S. Application Data

(60) Provisional application No. 61/988,853, filed on May 5, 2014.

(51) Int. Cl.
*H01L 21/56* (2006.01)
*H01L 21/48* (2006.01)
(Continued)

(52) U.S. Cl.
CPC ............ *H01L 21/568* (2013.01); *H01L 21/486* (2013.01); *H01L 21/56* (2013.01); *H01L 21/76802* (2013.01); *H01L 21/76877* (2013.01); *H01L 23/3107* (2013.01); *H01L 23/481* (2013.01); *H01L 23/49838* (2013.01); *H01L 23/5384* (2013.01); *H01L 23/5385* (2013.01); *H01L 24/11* (2013.01); *H01L 24/17* (2013.01); *H01L 24/81* (2013.01); *H01L 25/0655* (2013.01); *H01L 25/50* (2013.01); *H01L 21/4857* (2013.01); *H01L 23/145* (2013.01); *H01L 23/15* (2013.01); *H01L 23/49811* (2013.01); *H01L 24/13* (2013.01); *H01L 24/16* (2013.01); *H01L 24/32* (2013.01);
(Continued)

(58) Field of Classification Search
CPC ................................................. H01L 2224/023
See application file for complete search history.

(56) References Cited

U.S. PATENT DOCUMENTS 6,958,527 B2 10/2005 Hanaoka
8,344,495 B2 1/2013 Camacho et al.
(Continued)

OTHER PUBLICATIONS

Partial International Search Report—PCT/US2015/026451—ISA/EPO—Jun. 23, 2015.
(Continued)

*Primary Examiner* — Brett Feeney
*Assistant Examiner* — Erik T Peterson
(74) *Attorney, Agent, or Firm* — Loza & Loza, LLP

(57) ABSTRACT

Some novel features pertain to an integrated device (e.g., integrated package) that includes a base portion for the integrated device, a first die (e.g., first wafer level die), and a second die (e.g., second wafer level die). The base portion includes a first inorganic dielectric layer, a first set of interconnects located in the first inorganic dielectric layer, a second dielectric layer different from the first inorganic dielectric layer, and a set of redistribution metal layers in the second dielectric layer. The first die is coupled to a first surface of the base portion. The second die is coupled to the first surface of the base portion, the second die is electrically coupled to the first die through the first set of interconnects.

33 Claims, 19 Drawing Sheets

(51) Int. Cl.
*H01L 23/538* (2006.01)
*H01L 23/00* (2006.01)
*H01L 25/00* (2006.01)
*H01L 25/065* (2006.01)
*H01L 23/48* (2006.01)
*H01L 23/498* (2006.01)
*H01L 21/768* (2006.01)
*H01L 23/31* (2006.01)
*H01L 23/14* (2006.01)
*H01L 25/10* (2006.01)
*H01L 23/15* (2006.01)

(52) U.S. Cl.
CPC ............... *H01L 24/73* (2013.01); *H01L 24/83* (2013.01); *H01L 24/92* (2013.01); *H01L 25/105* (2013.01); *H01L 2224/023* (2013.01); *H01L 2224/131* (2013.01); *H01L 2224/13147* (2013.01); *H01L 2224/16055* (2013.01); *H01L 2224/16057* (2013.01); *H01L 2224/16227* (2013.01); *H01L 2224/16238* (2013.01); *H01L 2224/171* (2013.01); *H01L 2224/32225* (2013.01); *H01L 2224/73204* (2013.01); *H01L 2224/81005* (2013.01); *H01L 2224/81895* (2013.01); *H01L 2224/81896* (2013.01); *H01L 2224/83005* (2013.01); *H01L 2224/92125* (2013.01); *H01L 2225/1023* (2013.01); *H01L 2225/1058* (2013.01); *H01L 2924/01029* (2013.01); *H01L 2924/1434* (2013.01); *H01L 2924/1517* (2013.01); *H01L 2924/1533* (2013.01); *H01L 2924/15192* (2013.01); *H01L 2924/15311* (2013.01); *H01L 2924/18161* (2013.01)

(56) References Cited

U.S. PATENT DOCUMENTS

| 8,637,992 | B2 | 1/2014 | Sakuma et al. | |
|---|---|---|---|---|
| 2004/0119164 | A1* | 6/2004 | Kurashima | H01L 21/76832 257/758 |
| 2008/0023836 | A1* | 1/2008 | Watanabe | H01L 24/11 257/758 |
| 2008/0079163 | A1 | 4/2008 | Kurita et al. | |
| 2008/0246126 | A1 | 10/2008 | Bowles et al. | |
| 2009/0140442 | A1 | 6/2009 | Lin | |
| 2010/0155941 | A1 | 6/2010 | Matsuki et al. | |
| 2013/0075924 | A1* | 3/2013 | Lin | H01L 24/19 257/774 |
| 2013/0207260 | A1* | 8/2013 | Hsu | H01L 23/48 257/738 |
| 2014/0138817 | A1* | 5/2014 | Paek | H01L 24/10 257/737 |
| 2015/0179570 | A1* | 6/2015 | Marimuthu | H01L 24/97 257/774 |

OTHER PUBLICATIONS

International Search Report and Written Opinion—PCT/US2015/026451—ISA/EPO—Oct. 20, 2015.

* cited by examiner

Metal Layer(s) formed using Semi-Additive Patterning (SAP) Process

Metal Layer(s) formed using Damascene Process

Metal Layer(s) formed using Damascene Process + SAP Process

Metal Layer(s) formed using Damascene Process + SAP Process

Semi-Additive Patterning (SAP) Process

INTEGRATED DEVICE COMPRISING HIGH DENSITY INTERCONNECTS IN INORGANIC LAYERS AND REDISTRIBUTION LAYERS IN ORGANIC LAYERS

CLAIM OF PRIORITY/CLAIM OF BENEFIT

The present application claims priority to U.S. Provisional Application No. 61/988,853 titled "Integrated Device Comprising High Density Interconnects In Inorganic Layers And Redistributions Layers In Organic Layers", filed May 5, 2014, which is hereby expressly incorporated by reference herein.

BACKGROUND

1. Field

Various features relate to an integrated device that includes high density interconnects in inorganic layers and redistributions layers in organic layers.

2. Background

FIG. 1 illustrates a conventional integrated package 100 that includes a substrate 102, a first die 106, a second die 108, a first set of solder balls 116, a second set of solder balls 118, and a third set of solder balls 120. The first die 106 is coupled to the substrate 102 through the first set of solder balls 116. The second die 108 is coupled to the substrate 102 through the second set of solder balls 118. The third set of solder balls 120 is coupled to the substrate 102. Typically, the third set of solder balls 120 is coupled to a printed circuit board (PCB) (not shown).

Conventional integrated packages, such as the one described in FIG. 1, have certain limitations and downsides. For example, the substrate 102 of the integrated package 100 of FIG. 1 is typically made of an organic laminate (e.g., rigid or flexible), or a silicon (Si) interposer. The use of such materials as a substrate creates design problems when attempting to manufacture low profile integrated package. That is, these materials create substantial design penalty due to their manufacturing limitations. While organic laminate substrates may be cheap to fabricate, they cannot be used to fabricate high density interconnects. Silicon interposer fabrication processes on the other hand can be quite cost-prohibitive but is capable of fabricating high density interconnects.

Therefore, there is a need for an integrated package with high density interconnects that is overall cost effective to fabricate. Ideally, such an integrated package will also provide also takes up a little real estate as possible.

SUMMARY

Various features, apparatus and methods described herein provide integrated device that includes high density interconnects in inorganic layers and redistributions layers in organic layers.

A first example provides an integrated device that includes a base portion, a first die, and a second die. The base portion is for the integrated device. The base portion includes a first inorganic dielectric layer, a first set of interconnects, a second dielectric layer, and a set of redistribution metal layers. The first set of interconnects is in the first inorganic dielectric layer. The second dielectric layer is different from the first inorganic dielectric layer. The set of redistribution metal layers is in the second dielectric layer. The first die is coupled to a first surface of the base portion. The second die is coupled to the first surface of the base portion. The second die is electrically coupled to the first die through the first set of interconnects.

According to an aspect, the second dielectric layer is an organic dielectric layer.

According to an aspect, the first set of interconnects includes a first spacing that is less than a second spacing of the set of redistribution metal layers.

According to one aspect, the first set of interconnects includes a first pitch that is about 4 microns (μm) or less.

According to an aspect, the first set of interconnects includes a first seed layer and a first metal layer, where the first seed layer is coupled to the horizontal portion of the first metal layer and the side portions of the first metal layer.

According to one aspect, the first set of interconnects includes a first seed layer and a first metal layer, and the set of redistribution metal layers includes a second seed layer and a second metal layer, the second seed layer located only on the horizontal planar surface of the first set of interconnects.

According to an aspect, the first set of interconnects includes a first seed layer and a first metal layer, and the set of redistribution metal layers includes a second seed layer and a second metal layer, the second seed layer located only on the bottom planar surface of the first set of interconnects.

According to one aspect, the integrated device includes an encapsulation material that encapsulates the first die and the second die.

According to an aspect, the integrated device includes a second set of interconnects traversing the encapsulation material, the second set of interconnects configured to operate as a set of package-to-package interconnects in package-on-package (PoP) device.

According to one aspect, the second set of interconnects is one of at least a solder ball, and/or a through encapsulation via (TEV).

According to an aspect, the first die includes a first set of interconnect pillars, the first die being electrically coupled to the set of redistribution metal layers through the first set of interconnect pillars.

According to one aspect, the first set of interconnects in the first inorganic dielectric layer is a set of vias that couple to the set of redistribution metal layers in the second dielectric layer.

According to an aspect, the base portion is an interposer.

According to one aspect, the integrated device includes a second set of interconnects that couple the first die to the base portion.

According to an aspect, the second set of interconnects includes one of at least an under bump, a copper-copper bonding interconnect with oxide-to-oxide, and/or a copper-copper/Oxide-Oxide hybrid bonding.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a method for fabricating an integrated device. The method forms a base portion for the integrated device, where forming the base portion includes forming a first inorganic dielectric layer, forming a first set of interconnects in the first inorganic dielectric layer, forming a second dielectric layer different from the first inorganic dielectric layer, and forming a set of redistribution metal layers in the second dielectric layer. The method couples a first die to a first surface of the base portion. The method couples a second die to the first surface of the base portion. The second die is electrically coupled to the first die through the first set of interconnects.

According to an aspect, the second dielectric layer is an organic dielectric layer.

According to one aspect, the first set of interconnects comprises a first spacing that is less than a second spacing of the set of redistribution metal layers.

According to an aspect, the first set of interconnects comprises a first pitch that is about 4 microns (μm) or less.

According to one aspect, the first set of interconnects includes a first seed layer and a first metal layer, wherein the first seed layer is coupled to the horizontal portion of the first metal layer and the side portions of the first metal layer.

According to an aspect, the first set of interconnects includes a first seed layer and a first metal layer, and the set of redistribution metal layers includes a second seed layer and a second metal layer, the second seed layer located only on the horizontal planar surface of the first set of interconnects.

According to one aspect, the first set of interconnects includes a first seed layer and a first metal layer, and the set of redistribution metal layers includes a second seed layer and a second metal layer, the second seed layer located only on the bottom planar surface of the first set of interconnects.

According to an aspect, the method forms an encapsulation material that encapsulates the first die and the second die.

According to one aspect, the method forms a second set of interconnects that traverses the encapsulation material, the second set of interconnects configured to operate as a set of package-to-package interconnects in package-on-package (PoP) device.

According to an aspect, the second set of interconnects is one of at least a solder ball, and/or a through encapsulation via (TEV).

According to one aspect, the first die comprises a first set of interconnect pillars, the first die being electrically coupled to the set of redistribution metal layers through the first set of interconnect pillars.

According to an aspect, the first set of interconnects in the first inorganic dielectric layer is a set of vias that couple to the set of redistribution metal layers in the second dielectric layer.

According to one aspect, the method forms a second set of interconnects that couples the first die to the base portion.

According to an aspect, the second set of interconnects includes one of at least an under bump, a copper-copper bonding interconnect with oxide-to-oxide, and/or a copper-copper/Oxide-Oxide hybrid bonding.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

FIG. 11 (comprising FIGS. 11A, 11B, 11C, 11D, 11E) illustrates an exemplary sequence for providing/fabricating an integrated device.

Figure 12:
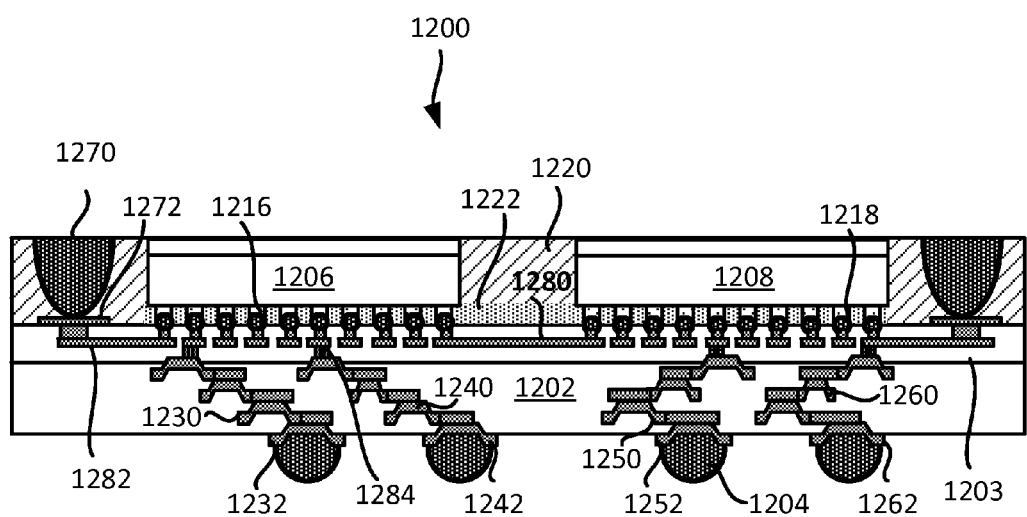

FIG. 12 illustrates another example of an integrated device.

Figure 13:
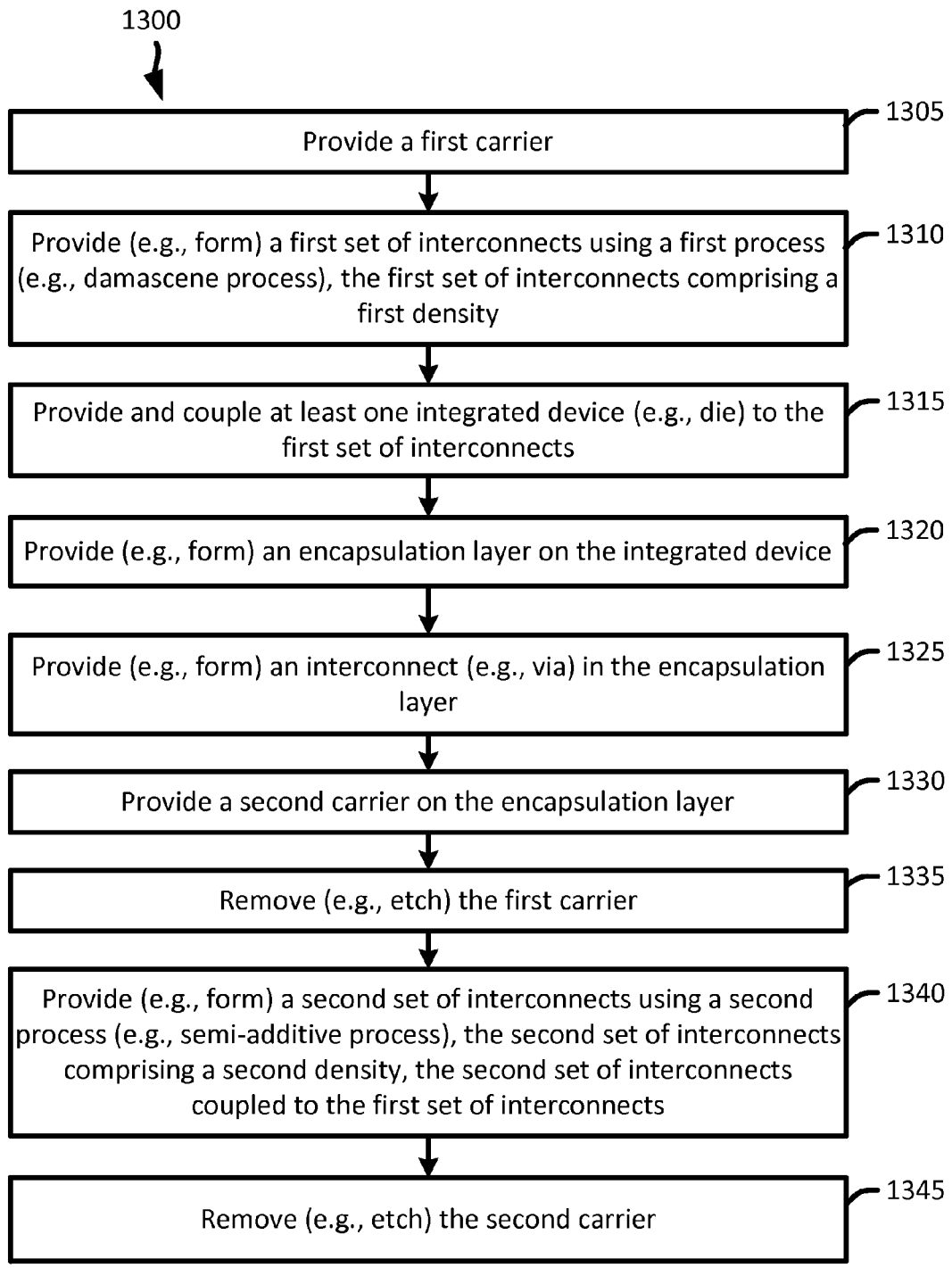

FIG. 13 illustrates an example of a flow diagram of a method for providing/fabricating an integrated device.

Figure 14A:
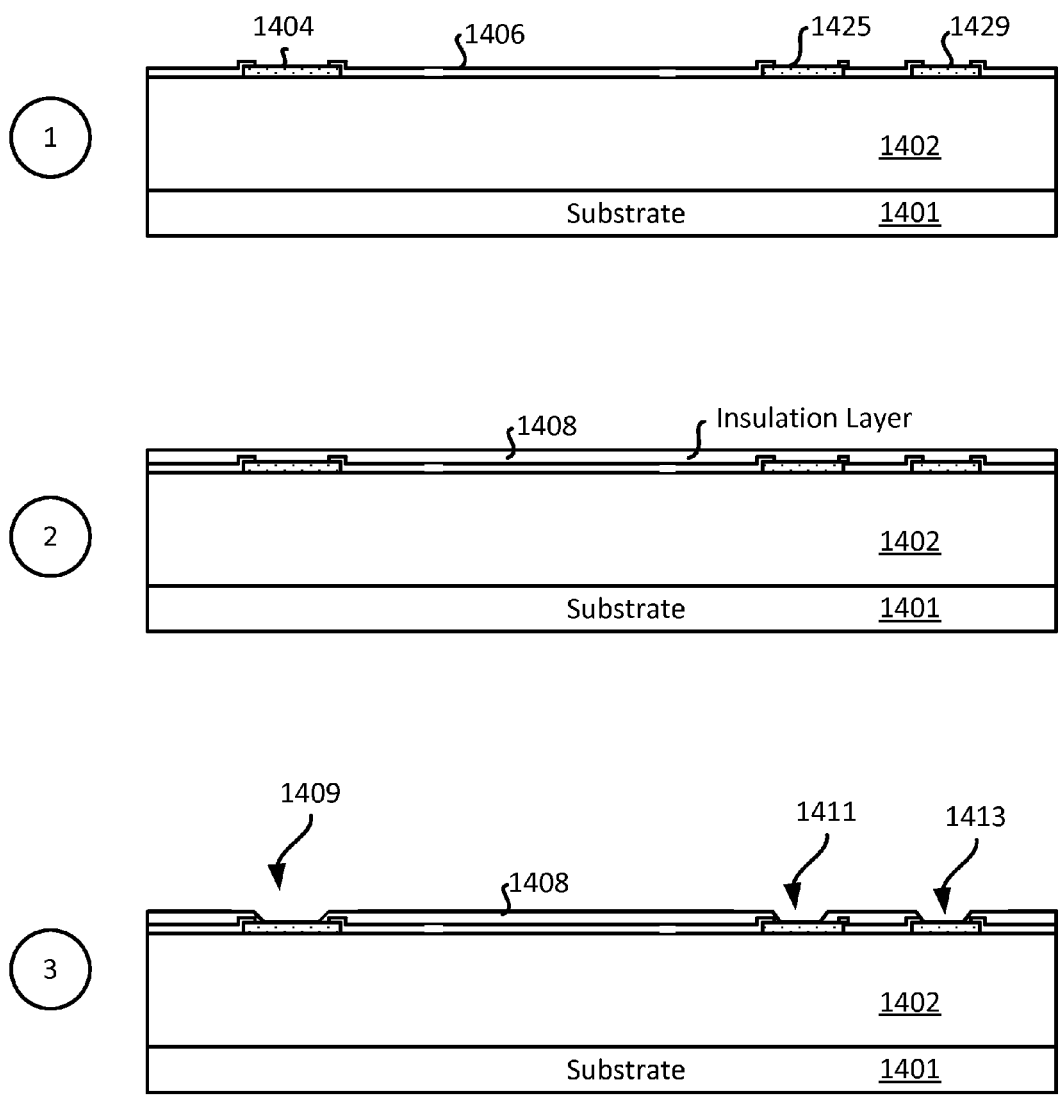
Figure 14B:
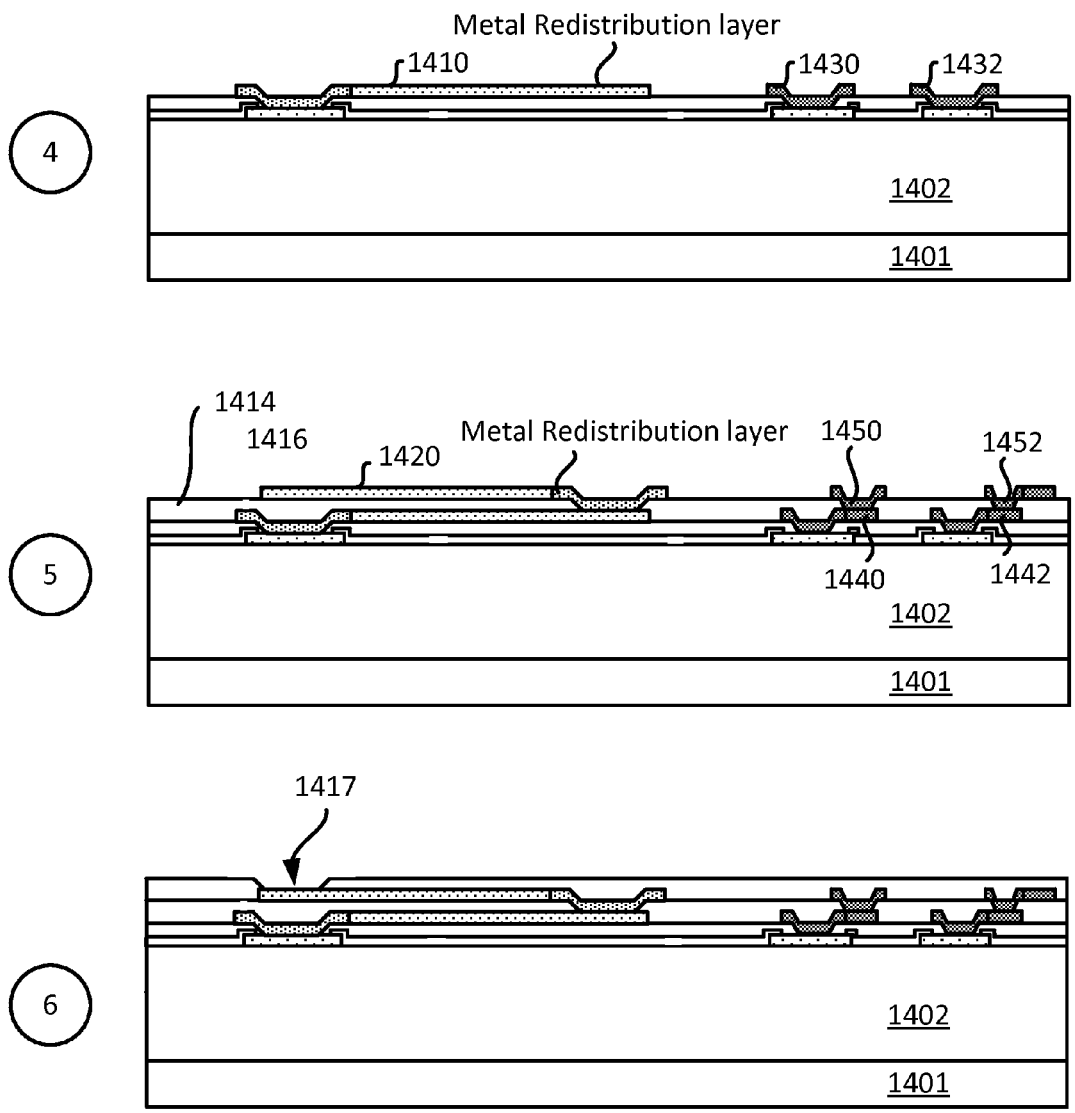
Figure 14C:
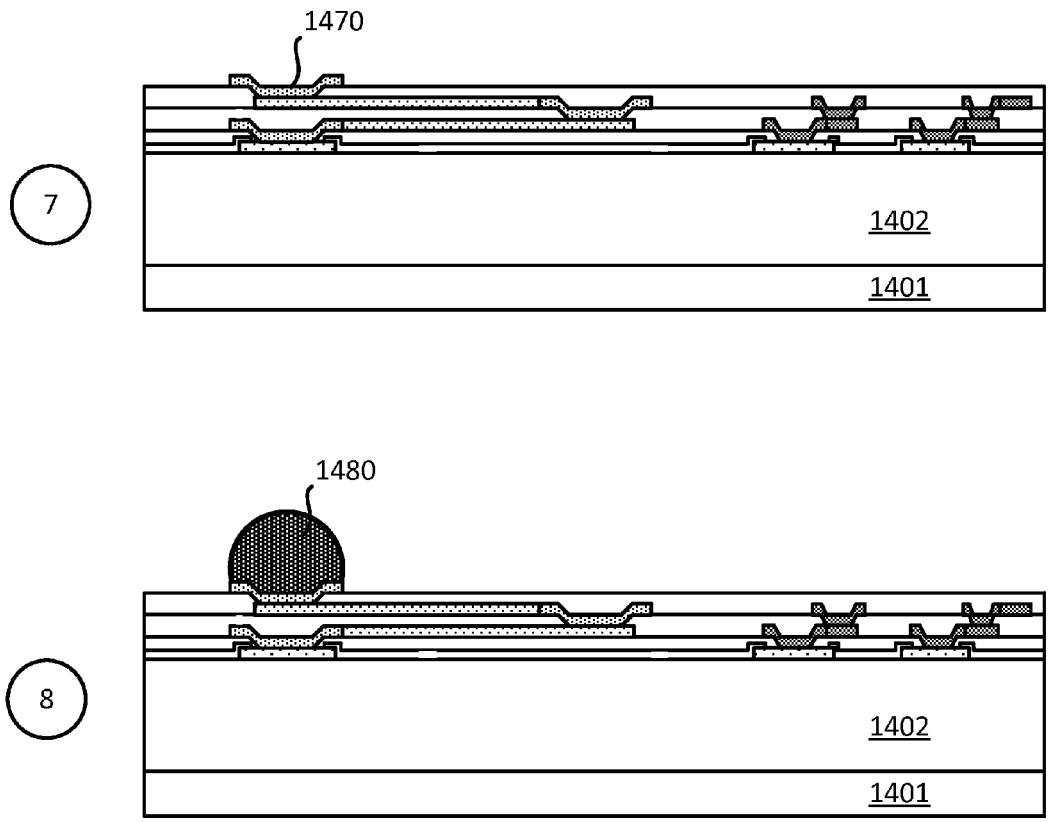

FIG. 14 (comprising FIGS. 14A, 14B, 14C) illustrates an exemplary sequence for providing/fabricating an integrated device.

Figure 15:
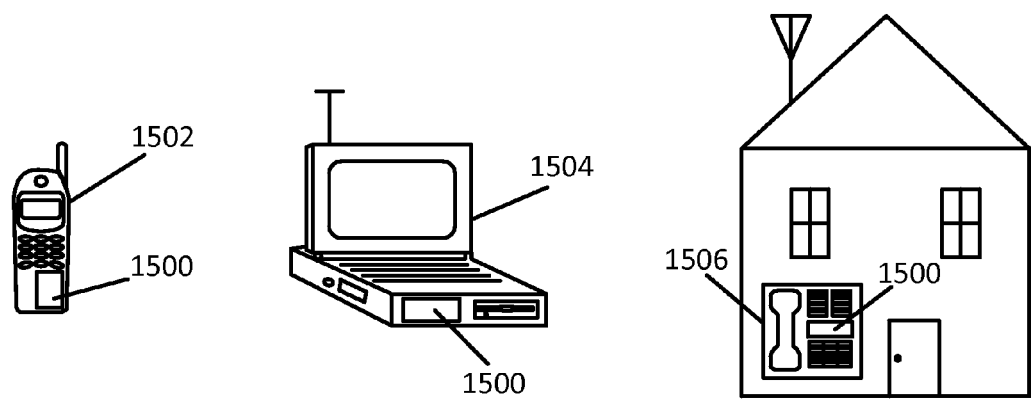

FIG. 15 illustrates various electronic devices that may integrate an integrated device, a substrate, a semiconductor device, a die, an integrated circuit and/or PCB described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., integrated package) that includes a base portion for the integrated device, a first die (e.g., first wafer level die), and a second die (e.g., second wafer level die). In some implementations, the base portion includes a redistribution portion. The base portion includes a first inorganic dielectric layer, a first set of interconnects located in the first inorganic dielectric layer, a second dielectric layer different from the first inorganic dielectric layer, and a set of redistribution metal layers in the second dielectric layer. The first die is coupled to a first surface of the base portion. The second die is coupled to the first surface of the base portion, the second die is electrically coupled to the first die through the first set of interconnects. The integrated device also includes an underfill. The underfill is between the first die and the base portion. The underfill is also between the second die and the base portion. In some implementations, the second dielectric layer is an organic dielectric layer. In some implementations, the first set of interconnects includes a first pitch that is less than a second pitch of the set of redistribution metal layers. In some implementations, the first set of interconnects comprises a first pitch that is about 4 microns (μm) or less. In some implementations, the first set of interconnects includes a first seed layer and a first metal layer, and the set of redistribution metal layers includes a second seed layer and a second metal layer. In some implementations, the second seed layer is located only on the horizontal planar surface of the first set of interconnects. In some implementations, the integrated device further includes an encapsulation material that encapsulates the first die and the second die. In some implementations, the integrated device includes a second set of interconnects traversing the encapsulation material. The second set of interconnects is configured to operate as a set of package-to-package interconnects in a package-on-package (PoP) device. In some implementations, the second set of interconnects is one of at least a solder ball, and/or a through encapsulation via (TEV).

TERMS AND DEFINITIONS

An interconnect is an element or component that allows or facilitates an electrical connection between two points, elements and/or components. In some implementations, an interconnect may include a trace, a via, a pad, a pillar, a redistribution metal layer, a redistribution interconnect, and/or an under bump metallization (UBM) layer. In some implementations, an interconnect is an electrically conductive material that provides an electrical path for a signal (e.g., data signal, ground signal, power signal). An interconnect may include one element/component or several elements/components that provide an electrical path for a signal. For example, an interconnect may be formed by several similar and/or different interconnects.

Figure 1:
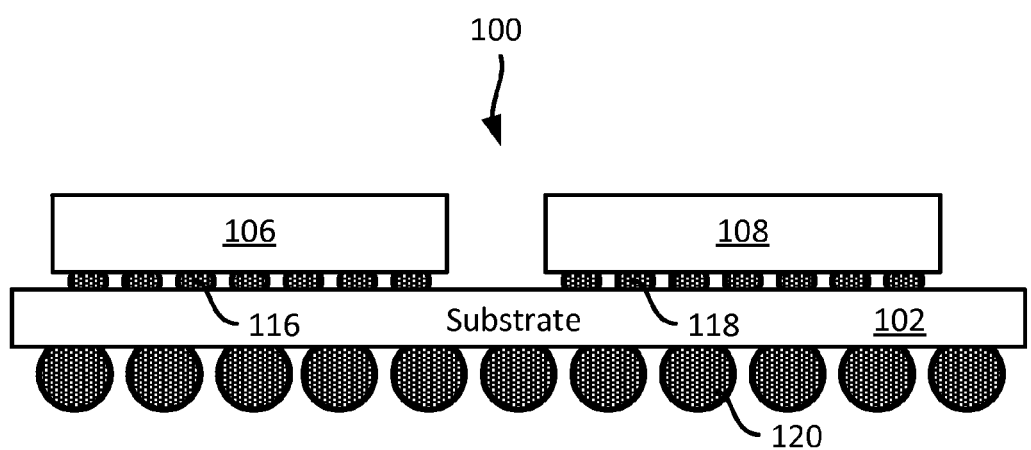
FIG. 1 illustrates a profile view of a conventional integrated device.
Figure 2:
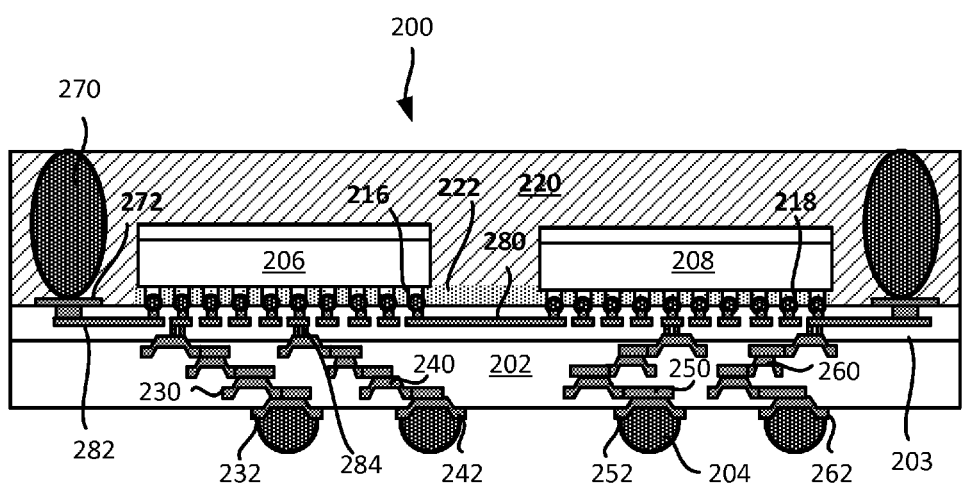
FIG. 2 illustrates an example of an integrated device.

Exemplary Integrated Device that High Density Inter-Die Interconnects in Hybrid Substrate Comprising Organic and Inorganic Dielectric Layers FIG. 2 conceptually illustrates an example of a side view of an integrated device (e.g., semiconductor device, integrated package) that includes several dies. Specifically, FIG. 2 illustrates an integrated device 200 (e.g., integrated package) that includes a first dielectric layer 202, a second dielectric layer 203, a first set of solder balls 204, a first die 206, a second die 208, an encapsulation material 220, and an underfill 222.

The first dielectric layer 202 is different than the second dielectric layer 203. The first dielectric layer 202 is an organic dielectric layer. The second dielectric layer 203 is an inorganic dielectric layer. In some implementations, the first dielectric layer 202 includes several organic dielectric layers. In some implementations, an organic dielectric layer may include one of at least polyimide, Polybenzoxazole (PBO) and/or a polymer layer. In some implementations, the second dielectric layer 203 includes several inorganic dielectric layers. In some implementations, an inorganic dielectric layer may include one of at least, silicon oxide, silicon nitride, silicon carbon, carbon comprising a SiN SiO2 film. In some implementations, the second dielectric layer 203 is a polymer film.

FIG. 2 illustrates that the first dielectric layer 202 includes a set of metal layers. In particular, the first dielectric layer 202 includes a first set of redistribution interconnects 230, a first under bump (UBM) layer 232, a second set of redistribution interconnects 240, a second under bump (UBM) layer 242, a third set of redistribution interconnects 250, a third under bump (UBM) layer 252, a fourth set of redistribution interconnects 260, and a fourth under bump (UBM) layer 262. In some implementations, the first, second, third, and fourth redistribution interconnects 230, 240, 250, and 260 are redistribution layers in the dielectric layer 202. The redistribution layers may include vias. Different implementations may have different number of redistribution metal layers (e.g., 1, 2 or more metal layers). In some implementations, a portion of the first redistribution layers 230 may be embedded into the second dielectric layer 203 for electrical connection. In some implementations, the first dielectric layer 202 and/or the second dielectric layer is/are part of a base portion of the integrated device 200. In some implementations, the first dielectric layer 202 is part of a redistribution portion of the base portion.

In some implementations, the metal layers in the first dielectric layer 202 are fabricated using semi-additive patterning (SAP) process. An example of a SAP process is further described in FIGS. 7-8. In some implementations, one result of using a SAP process is that at least one redistribution layer has two metal layers, a first seed metal layer and a second metal layer. In some implementations, the first seed metal layer is formed along only the base portion of the redistribution layers.

FIG. 2 also illustrates that the second dielectric layer 203 includes a set of metal layers. In some implementations, the set of metal layers in the second dielectric layer 203 are interconnects that have higher density (e.g., lower pitch) than the metal layers in the first dielectric layer 202. In particular, the second dielectric layer 203 includes a first set of high density interconnects 280, a second set of high density interconnects 282, and a third set of high density interconnects 284. In some implementations, the third set of high density interconnects 284 may be via structures. In some implementations, the third set of high density interconnects 284 may be optional. The first set of high density interconnects 280 are inter-die interconnects that electrically couple the first die 206 and the second die 208. The second set of high density interconnects 282 are interconnects that electrically couple to metal layers in the first dielectric layer 202. For example, in some implementations, the second set of high density interconnects 282 electrically couple to one of the redistribution metal layers in the first dielectric layer 202. In some implementations, the second set of high density interconnects 282 is electrically coupled to the third set of high density interconnects 284. In such instances, the third set of high density interconnects 284 is electrically coupled to one or more of the redistribution metal layers (e.g., interconnects 230, 240, 250, 260) in the first dielectric layer 202. The second set of high density interconnects 282 are interconnects that electrically couple to a package interconnect 270 through a pad 272. In some implementations, at least some of the set of metal layers in the second dielectric layer 203 have a pitch of about 4 microns (μm) or less.

In some implementations, the second set of high density interconnects 282 may include high density traces and/or vias. In some implementations, the third set of high density interconnects 284 may include high density traces and/or vias. In some implementations, the metal layers in the second dielectric layer 203 are fabricated using a damascene process. An example of a damascene process is further described in FIGS. 9-10. In some implementations, one result of using a damascene process is that at least one interconnect has a first metal layer, and an optional second metal layer.

Different implementations may use different materials for the encapsulation material 220. For example, the encapsulation material 220 may include one of at least a mold, an epoxy and/or a polymer fill. The package interconnect 270 and the pad 272 are located within the encapsulation material 220. FIG. 2 illustrates that the package interconnect 270 is a solder ball. However, in some implementations, the package interconnect 270 may be another interconnect.

The dies (e.g., first die 206, second die 208) may represent different types of dies, such as memory dies, and/or processors. In some implementations, the first die 206 and/or the second die 208 are wafer level dies.

The first die 206 is coupled to a first surface of the dielectric layer 202 through the first set of interconnects 216. In some implementations, the first set of interconnects 216 are metal pillars (e.g., metal layers). In some implementations, the metal pillars are copper pillars. The first set of interconnects 216 may or may not include solder balls. In some implementations, the first die 206 is electrically coupled to at least one of the set of solder balls 204 through the first set of interconnects 216, the first set of redistribution interconnects 230, the first UBM layer 232, the second set of redistribution interconnects 240, and/or the second UBM layer 242. In some implementations, the interconnects (e.g., interconnects 216) may be metal pads such that no underfill 222 is required.

The second die 208 is coupled to the first surface of the dielectric layer 202 through the second set of interconnects 218. In some implementations, the second set of interconnects 218 are metal pillars (e.g., metal layers). In some implementations, the metal pillars are copper pillars. The second set of interconnects 218 may or may not include solder balls. In some implementations, the second die 208 is electrically coupled to at least one of the set of solder balls 204 through the second set of interconnects 218, the third set of redistribution interconnects 250, and/or the third UBM layer 252.

In some implementations, the integrated device 200 includes a base portion. The base portion may include a redistribution portion. In some implementations, the base portion includes the first dielectric layer 202, the second dielectric layer 203, the first set of redistribution interconnects 230, the first under bump (UBM) layer 232, the second set of redistribution interconnects 240, the second under bump (UBM) layer 242, the third set of redistribution interconnects 250, the third under bump (UBM) layer 252, the fourth set of redistribution interconnects 260, the fourth under bump (UBM) layer 262, the first set of high density interconnects 280, the second set of high density interconnects 282, and/or the third set of high density interconnects 284.

In some implementations, the redistribution portion includes the first dielectric layer 202, the first set of redistribution interconnects 230, the first under bump (UBM) layer 232, the second set of redistribution interconnects 240, the second under bump (UBM) layer 242, the third set of redistribution interconnects 250, the third under bump (UBM) layer 252, the fourth set of redistribution interconnects 260, and/or the fourth under bump (UBM) layer 262.

FIG. 2 illustrates that the first set of interconnects 216 and the second set of interconnects 218 are encapsulated by the underfill 222. The underfill 222 is optional in some instances.

Figure 3:
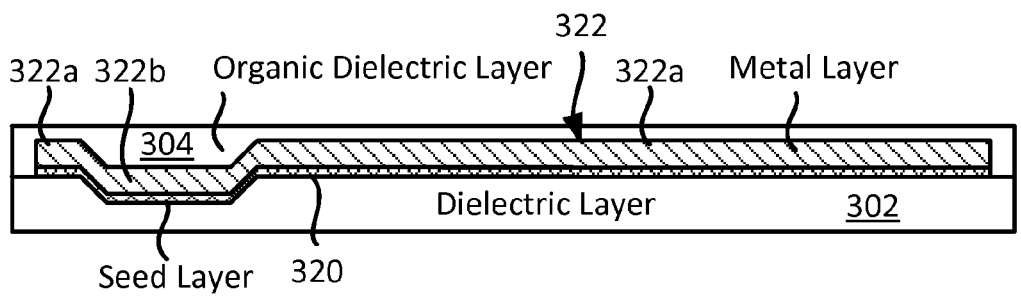
FIG. 3 illustrates an example of a metal layer formed using a semi-additive patterning (SAP) process.

FIG. 3 illustrates a detailed profile view of a metal layer formed using a semi-additive patterning (SAP) process. Specifically, FIG. 3 illustrates a first dielectric layer 302, a second organic dielectric layer 304, a first seed layer 320, and a second metal layer 322. The first seed layer 320 is a metal layer (e.g., TiCu, TiWCu). In some implementations, the first seed layer 320 is formed by a first deposition process (e.g., physical vapor deposition (PVD) or plating process). The second metal layer 322 is formed by a second deposition process (e.g., plating process). The second metal layer 322 includes a first metal portion layer 322a and a second metal portion layer 322b. In some implementations, the first metal portion layer 322a is a metal trace. In some implementations, the second metal portion 322b is a via/via structure. As shown in FIG. 3, the first seed layer 320 is formed in a base portion of the second metal layer 322. FIG. 3 illustrates that the first seed layer 320 is not formed in the side planar portion of the second metal layer 322. More specifically, FIG. 3 illustrates that the first seed layer 320 is formed on the base portion (e.g., bottom portion) of the second metal layer 322, but not on the boundary side portions of the second metal layer 322. As described above, the second metal layer 322 includes a first metal portion layer 322a and a second metal portion layer 322b. The first seed layer 320 is formed on the base portion of both the first metal portion layer 322a and the second metal portion layer 322b. The first seed layer 320 is formed on the side portion/wall of the second metal portion layer 322b (e.g., side portion/wall of the via/via structure), but not on the side portion/wall/boundary of the first metal portion layer 322a. The metal layers may be formed using a semi-additive patterning (SAP) process. As mentioned above, FIGS. 7-8 illustrate an example of a semi-additive patterning (SAP) process in some implementations.

Figure 4:
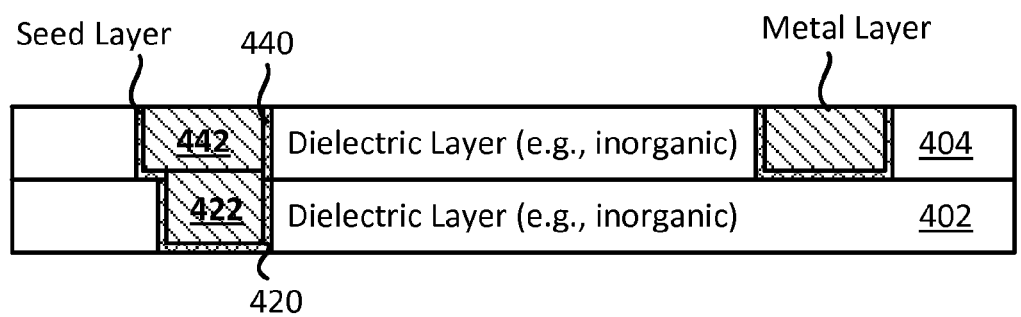
FIG. 4 illustrates an example of metal layers formed using a damascene process.

FIG. 4 illustrates a detailed profile view of a metal layer formed using a damascene process. Specifically, FIG. 4 illustrates a first dielectric layer 402 (e.g., inorganic dielectrics, polymer), a second dielectric layer 404 (e.g., inorganic dielectrics, polymer), a first seed layer 420, a second metal layer 422, a third seed layer 440, and a fourth metal layer 442. The first seed layer 420 and/or the third seed layer 440 are metal layers (e.g., TiTiN/Cu, TaTaN/Cu). In some implementations, the first seed layer 420 and/or the third seed layer 440 are formed by a first deposition process (e.g., chemical vapor deposition (CVP) or physical vapor deposition (PVD)). The second metal layer 422 and/or the fourth metal layer 442 are formed by a second deposition process (e.g., plating process). As shown in FIG. 4, the first seed layer 420 is formed in a base horizontal planar portion and a side planar portion (e.g., vertical planar portion) of the second metal layer 422. Similarly, the third seed layer 440 is formed in a base horizontal planar portion and a side planar portions (e.g., vertical planar portions) of the fourth metal layer 442. As mentioned above, FIGS. 9-10 illustrate an example of a damascene process in some implementations.

Figure 5:
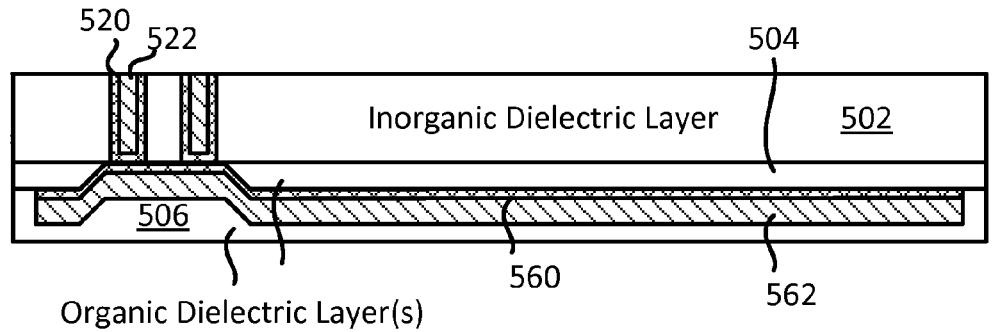
FIG. 5 illustrates an example of metal layer(s) formed using a damascene process and a semi-additive patterning (SAP) process.

FIG. 5 illustrates a detailed profile view of metal layers formed using damascene process and a semi-additive patterning (SAP) process. Specifically, FIG. 5 illustrates a first inorganic dielectric layer 502, a second organic dielectric layer 504, a third organic dielectric layer 506, a first seed layer 520, and a second metal layer 522, a third seed layer 560, and a fourth metal layer 562. The first seed layer 520 and the third seed layer are metal layers (e.g., copper layer). In some implementations, the first seed layer 520 is formed by a first deposition process (e.g., PVD, CVD or plating process). The second metal layer 522 is formed by a second deposition process (e.g., plating process).

Figure 6:
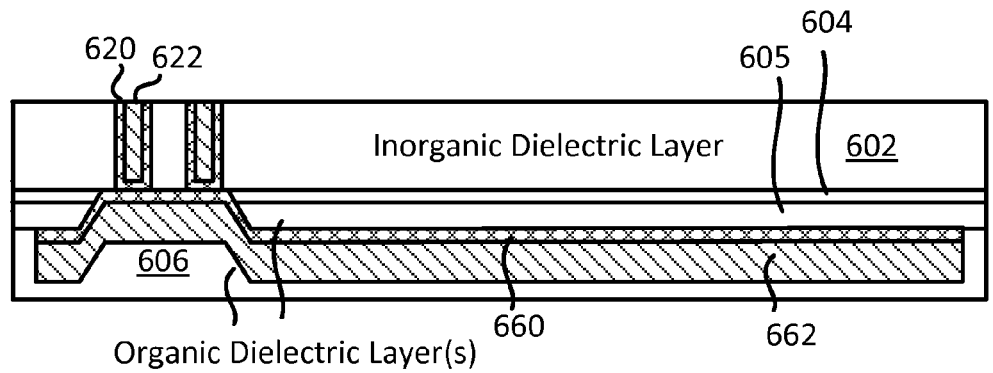
FIG. 6 illustrates an example of metal layer(s) formed using a damascene process and a SAP process with two interface layers.

FIG. 6 illustrates a detailed profile view of metal layers formed using damascene process and a semi-additive patterning (SAP) process. FIG. 6 illustrates an example of how metal layers are formed using a damascene process and a SAP process with two interface layers 604 and 605 (e.g., dielectric layers) which may be a combination of an organic film and an inorganic film. Specifically, FIG. 6 illustrates a first inorganic dielectric layer 602, a first interface layer 604, a second interface layer 605, a second organic dielectric layer 606, a first seed layer 620, and a second metal layer 622, a third seed layer 660, and a fourth metal layer 662. In some implementations, the first and second interface layers 604 and 605 are dielectric layers that include an inorganic film and an organic film. For example, in some implementations, the first interface layer 604 includes an inorganic film and the second interface layer 605 includes an organic film.

The first seed layer 620 and the third seed layer are metal layers (e.g., copper layer). In some implementations, the first seed layer 620 is formed by a first deposition process (e.g., PVD, CVD, plating process). The second metal layer 622 is formed by a second deposition process (e.g., plating process).

Exemplary Semi-Additive Patterning (SAP) Process

Figure 7:
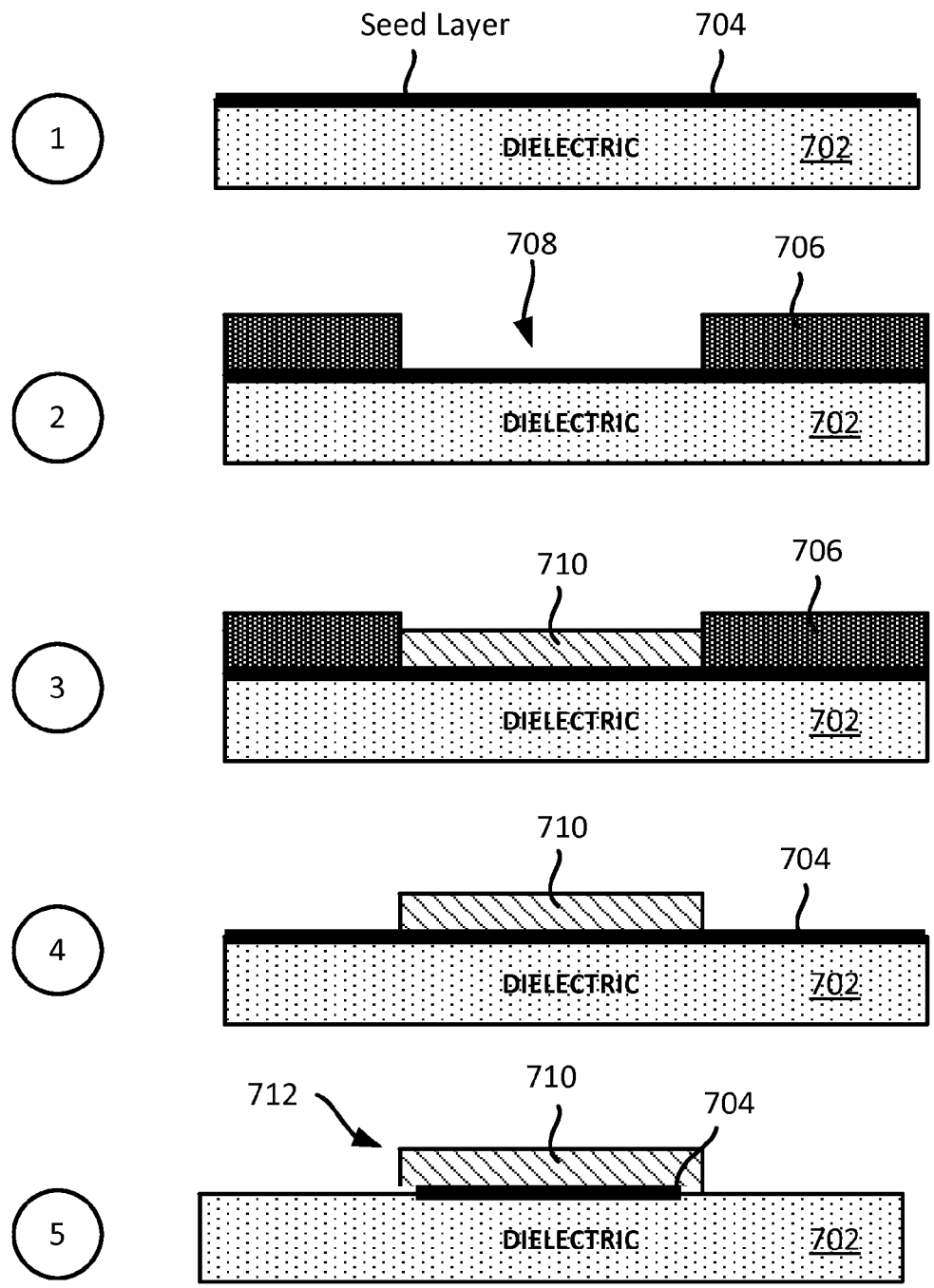
FIG. 7 illustrates an example of a semi-additive patterning (SAP) process.

FIG. 7 illustrates a sequence for forming an interconnect using a semi-additive patterning (SAP) process to provide and/or form an interconnect in one or more dielectric layer(s). As shown in FIG. 7, stage 1 illustrates a state of an integrated device (e.g., substrate) after a dielectric layer 702 is provided (e.g., formed). In some implementations, stage 1 illustrates that the dielectric layer 702 includes a first metal layer 704. The first metal layer 704 is a seed layer in some implementations. In some implementations, the first metal layer 704 may be provided (e.g., formed) on the dielectric layer 702 after the dielectric layer 702 is provided (e.g., received or formed). Stage 1 illustrates that the first metal layer 704 is provided (e.g., formed) on a first surface of the dielectric layer 702. In some implementations, the first metal layer 704 is provided by using a deposition process (e.g., PVD, CVD, plating process).

Stage 2 illustrates a state of the integrated device after a photo resist layer 706 (e.g., photo develop resist layer) is selectively provided (e.g., formed) on the first metal layer 704. In some implementations, selectively providing the resist layer 706 includes providing a first resist layer 706 on the first metal layer 704 and selectively removing portions of the resist layer 706 by developing (e.g., using a development process). Stage 2 illustrates that the resist layer 706 is provided such that a cavity 708 is formed.

Stage 3 illustrates a state of the integrated device after a second metal layer 710 is formed in the cavity 708. In some implementations, the second metal layer 710 is formed over an exposed portion of the first metal layer 704. In some implementations, the second metal layer 710 is provided by using a deposition process (e.g., plating process).

Stage 4 illustrates a state of the integrated device after the resist layer 706 is removed. Different implementations may use different processes for removing the resist layer 706.

Stage 5 illustrates a state of the integrated device after portions of the first metal layer 704 are selectively removed. In some implementations, one or more portions of the first metal layer 704 that is not covered by the second metal layer 706 is removed. As shown in stage 5, the remaining first metal layer 702 and the second metal layer 710 may form and/or define an interconnect 712 (e.g., trace, vias, pads) in an integrated device and/or a substrate. In some implementations, the first metal layer 706 is removed such that a dimension (e.g., length, width) of the first metal layer 706 underneath the second metal layer 710 is smaller than a dimension (e.g., length, width) of the second metal layer 710, which can result in an undercut, as shown at stage 5 of FIG. 7. In some implementations, the above mentioned processes may be iterated several times to provide and/or form several interconnects in one or more dielectric layers of an integrated device and/or substrate.

Figure 8:
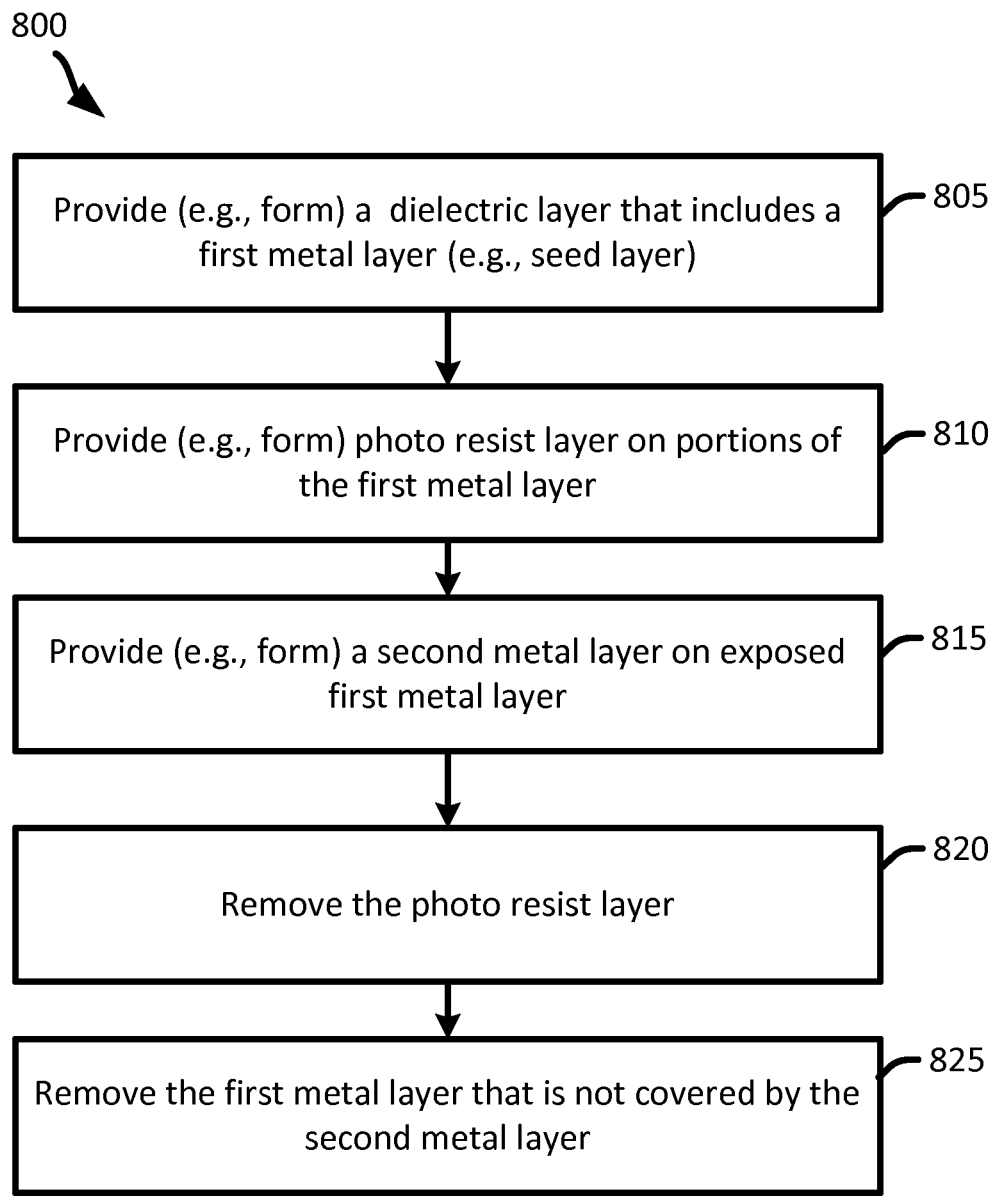
FIG. 8 illustrates an example of flow diagram of a semi-additive patterning (SAP) process.

FIG. 8 illustrates a flow diagram for a method for using a (SAP) process to provide and/or form an interconnect in one or more dielectric layer(s). The method provides (at 805) a dielectric layer (e.g., dielectric layer 702). In some implementations, providing the dielectric layer includes forming the dielectric layer. In some implementations, providing the dielectric layer includes forming a first metal layer (e.g., first metal layer 704). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 810) a photo resist layer (e.g., a photo develop resist layer 706) on the first metal layer. In some implementations, selectively providing the resist layer includes providing a first resist layer on the first metal layer and selectively removing portions of the resist layer (which provides one or more cavities).

The method then provides (at 815) a second metal layer (e.g., second metal layer 710) in the cavity of the photo resist layer. In some implementations, the second metal layer is formed over an exposed portion of the first metal layer. In some implementations, the second metal layer is provided by using a deposition process (e.g., plating process).

The method further removes (at 820) the resist layer. Different implementations may use different processes for removing the resist layer. The method also selectively removes (at 825) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 9:
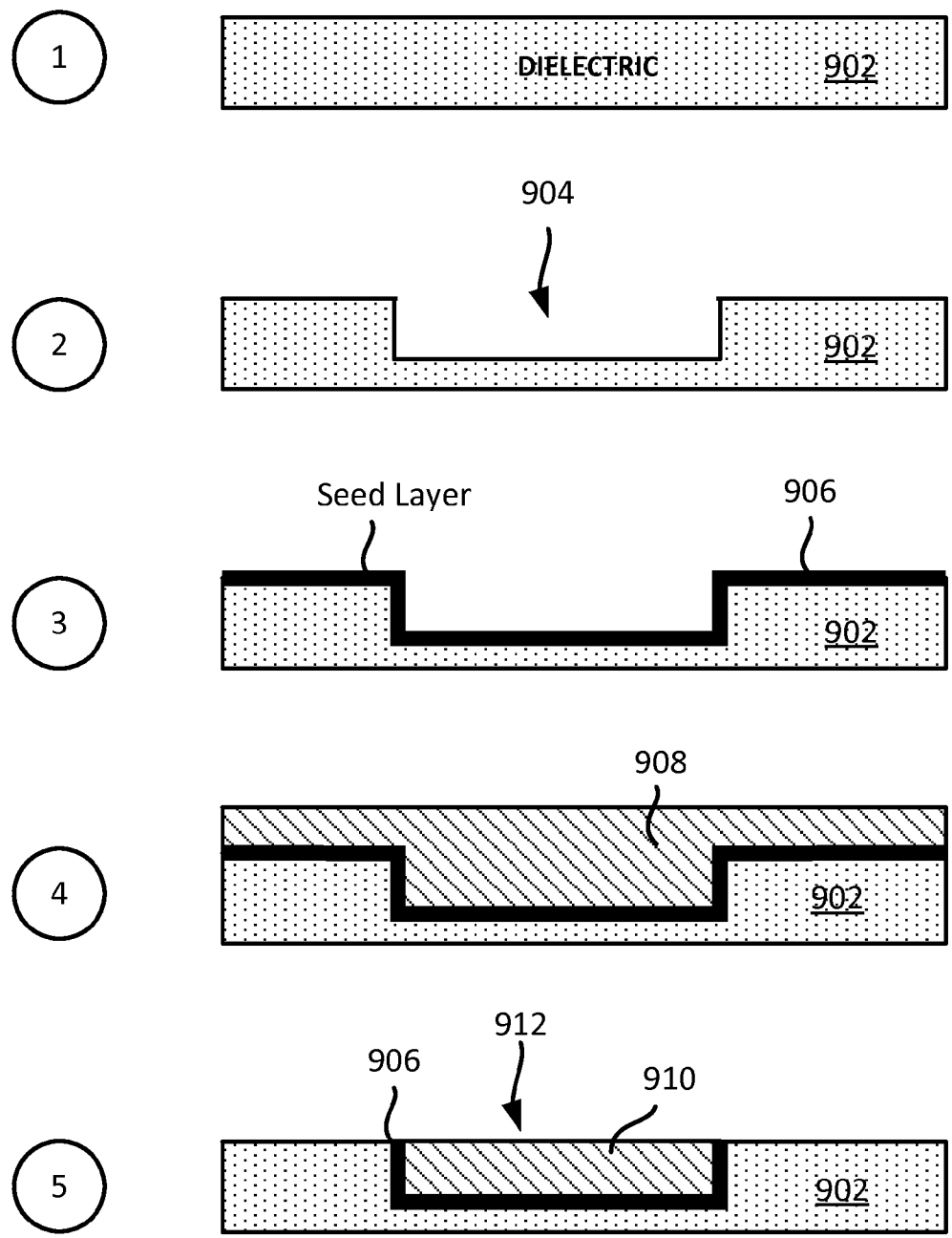
FIG. 9 illustrates an example of a damascene process.

FIG. 9 illustrates a sequence for forming an interconnect using a damascene process to provide and/or form an interconnect in a dielectric layer. As shown in FIG. 9, stage 1 illustrates a state of an integrated device after a dielectric layer 902 is provided (e.g., formed). In some implementations, the dielectric layer 902 is an inorganic layer (e.g., inorganic film).

Stage 2 illustrates a state of an integrated device after a cavity 904 is formed in the dielectric layer 902. Different implementations may use different processes for providing the cavity 904 in the dielectric layer 902.

Stage 3 illustrates a state of an integrated device after a first metal layer 906 is provided on the dielectric layer 902. As shown in stage 3, the first metal layer 906 provided on a first surface of the dielectric later 902. The first metal layer 906 is provided on the dielectric layer 902 such that the first metal layer 906 takes the contour of the dielectric layer 902 including the contour of the cavity 904. The first metal layer 906 is a seed layer in some implementations. In some implementations, the first metal layer 906 is provided by using a deposition process (e.g., physical vapor deposition (PVD), Chemical Vapor Deposition (CVP) or plating process).

Stage 4 illustrates a state of the integrated device after a second metal layer 908 is formed in the cavity 904 and a surface of the dielectric layer 902. In some implementations, the second metal layer 908 is formed over an exposed portion of the first metal layer 906. In some implementations, the second metal layer 908 is provided by using a deposition process (e.g., plating process).

Stage 5 illustrates a state of the integrated device after the portions of the second metal layer 908 and portions of the first metal layer 906 are removed. Different implementations may use different processes for removing the second metal layer 908 and the first metal layer 906. In some implementations, a chemical mechanical planazation (CMP) process is used to remove portions of the second metal layer 908 and portions of the first metal layer 906. As shown in stage 5, the remaining first metal layer 906 and the second metal layer 908 may form and/or define an interconnect 912 (e.g., trace, vias, pads) in an integrated device and/or a substrate. As shown in stage 5, the interconnect 912 is formed in such a way that the first metal layer 906 is formed on the base portion and the side portion(s) of the second metal layer 910. In some implementations, the cavity 904 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 10:
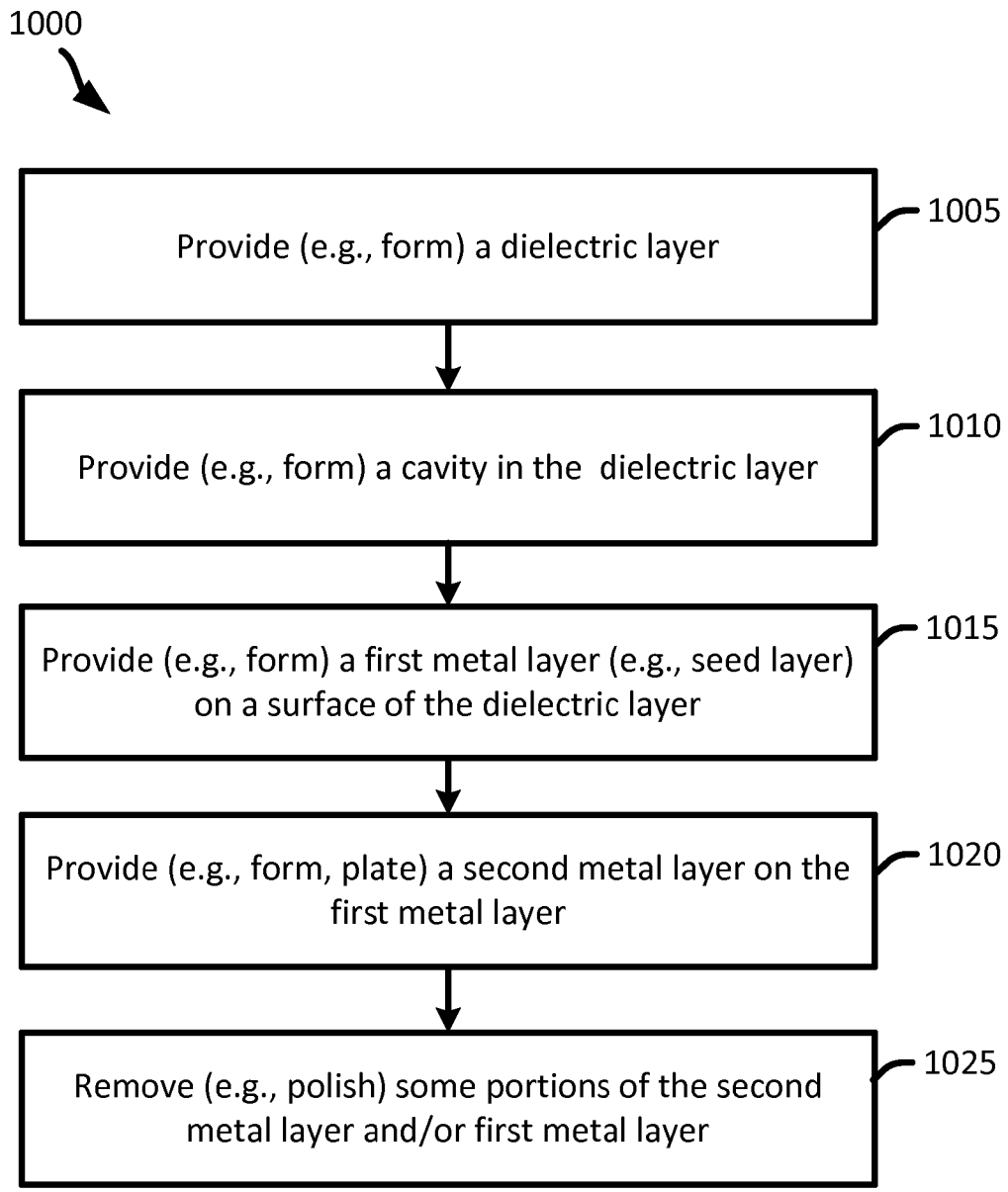
FIG. 10 illustrates an example of a flow diagram of a damascene process.

FIG. 10 illustrates a flow diagram of a method for forming an interconnect using a damascene process to provide and/or form an interconnect in a dielectric layer. The method provides (at 1005) a dielectric layer (e.g., dielectric layer 902). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1010) at least one cavity (e.g., cavity 904) in the dielectric layer. Different implementations may use different processes for providing the cavity in the dielectric layer.

The method provides (at 1015) a first metal layer (e.g., first metal layer 906) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 906 is provided by using a deposition process (e.g., PVD, CVD or plating process).

The method provides (at 1020) a second metal layer (e.g., second metal layer 908) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1025) portions of the second metal layer and portions of the first metal layer. Different implementations may use different processes for removing the second metal layer and the first metal layer. In some implementations, a chemical mechanical planazation (CMP) process is used to remove portions of the second metal layer and portions of the first metal layer. In some implementations, the remaining first metal layer and the second metal layer may form and/or define an interconnect (e.g., interconnect 912). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Sequence for Providing/Fabricating an Integrated Device that High Density Inter-Die Interconnects in Hybrid Substrate Comprising Organic and Inorganic Dielectric Layers In some implementations, fabricating an integrated device (e.g., integrated package) and/or substrate includes several processes. FIG. 11 (which includes FIGS. 11A-11E) illustrates an exemplary sequence for providing an integrated device. In some implementations, the sequence of FIGS. 11A-11E may be used to provide/manufacture the integrated device of FIG. 2, and/or other integrated devices described in the present disclose.

It should be noted that the sequence of FIGS. 11A-11E may combine one or more stages in order to simplify and/or clarify the sequence for providing an integrated device that includes several dies.

In some implementations, the process of FIGS. 11A-11E illustrate a novel process that provides an integrated device with high density interconnects (e.g., pitch between interconnects is about 4 microns or less) and/or an integrated device that bypasses the use of unnecessary big landing pads (e.g., big bump pads).

Stage 1 of FIG. 10A illustrates a state after a first carrier (e.g., carrier 1000) is provided. In some implementations, the carrier is a substrate and/or a wafer. Different implementations may use different materials for the carrier (e.g., silicon substrate, glass substrate, ceramic substrate).

Stage 2 illustrates a state after a first dielectric layer 1102 is provided on a first surface (e.g., top surface) of the first carrier 1100. In some implementations, the first dielectric layer 1102 is formed on the first carrier 1100. Different implementations may use different materials for the first dielectric layer 1102. For example, in some implementations, the first dielectric layer 1102 is one of at least an inorganic dielectric layer (e.g., inorganic film, SiO2, SiN, SiC or combination thereof).

Stage 3 illustrates a state after a first set of interconnects 1104 and a second set of interconnects 1106 are provided (e.g., formed) in the second dielectric layer 1105. In some implementations, the second dielectric layer 1105 is an inorganic dielectric layer. In some implementations, the first set of interconnects 1104 are high density vias (e.g., via that have diameters of about 2 microns (μm) or less). In some implementations, the second set of interconnects 1106 are high density traces (e.g., traces that have a pitch of about 4 microns (μm) or less). In some implementations, one or more of the first set of interconnects 1104 and/or the second set of interconnects 1106 include a first metal layer (e.g. seed layer) and a second metal layer, as shown and described in FIGS. 4 and/or 9. In some implementations, the first set of interconnects 1104 is optional. That is the second set of interconnects 1106 is formed but the first set of interconnects 1104 is not. In some implementations, the first set of interconnects 1104 and the second set of interconnects 1106 are formed by using the process described and illustrated in FIGS. 9-10. It should be noted that in some implementations, there may be just one metal layer or more than two metal layers in the dielectric layer 1105.

Stage 4 illustrates a state after a third dielectric layer 1107 is provided (e.g., formed) and a set of cavities 1108 (e.g., holes) are formed in the third dielectric layer. In some implementations, the third dielectric layer 1107 is an inorganic dielectric layer. In some implementations, the third dielectric layer 1107 is an organic dielectric layer.

Stage 5 illustrates a state after a third set of interconnects 1110 is formed in/on the third dielectric layer 1107. In some implementations, one or more of the third set of interconnects 1110 includes a first metal layer (e.g. seed layer) and a second metal layer, as shown and described in FIGS. 3 and/or 7. The third set of interconnects 1110 may form pads, vias and/or traces (e.g., traces configured to couple to solder ball, bumps, pillars of a die).

Figure 11A:
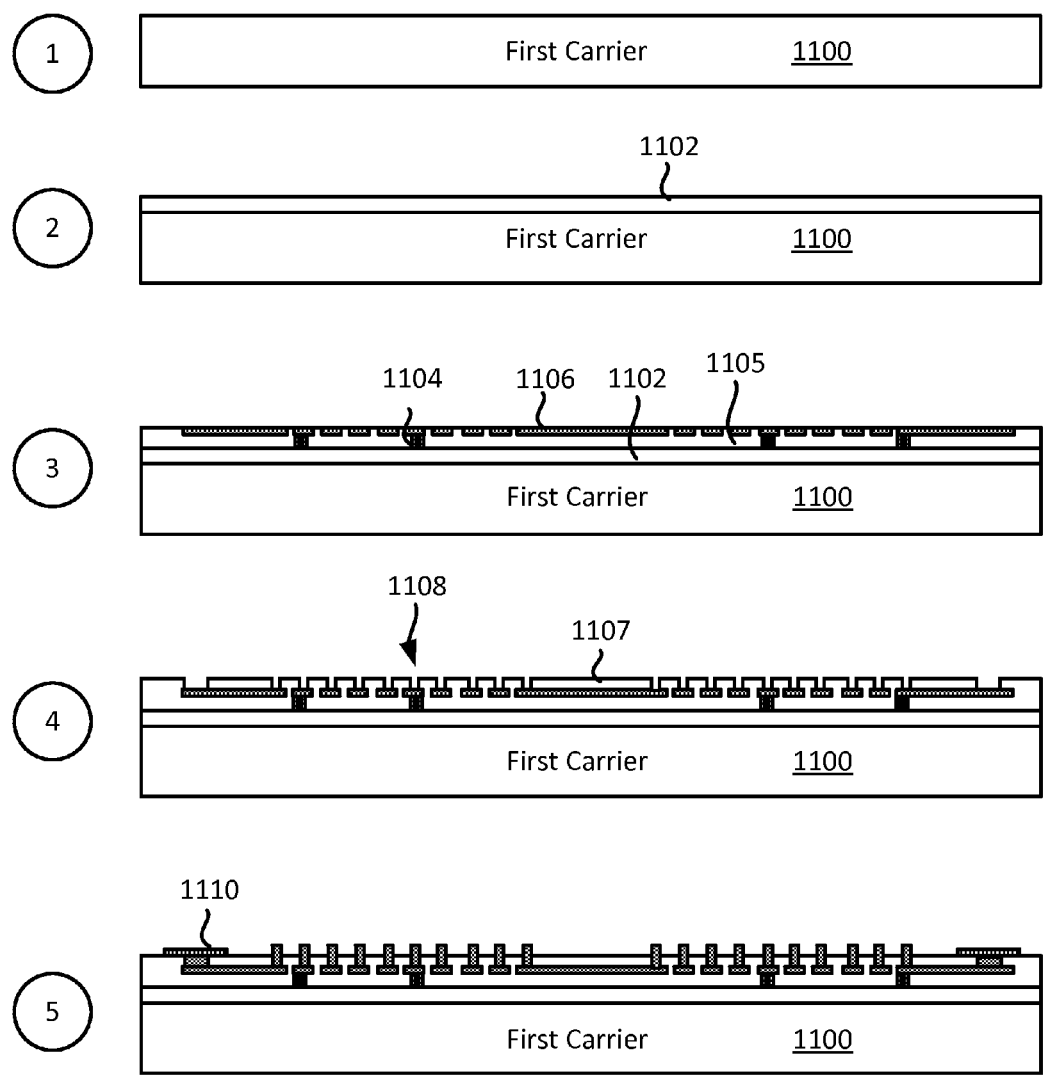
Figure 11B:
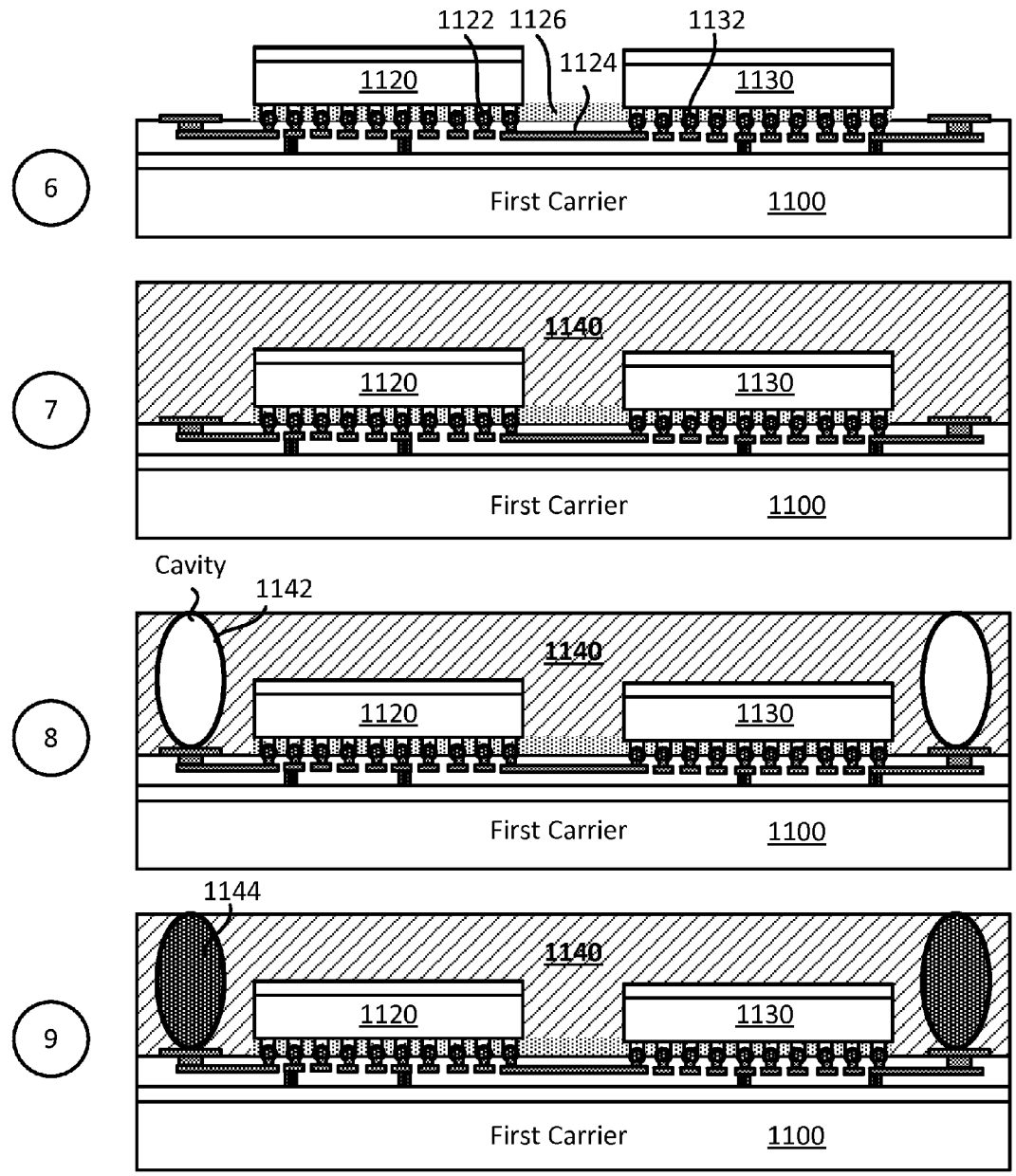

Stage 6 as shown in FIG. 11B, illustrates a state after a first die 1120 and a second die 1130 are coupled to the third dielectric layer 1107 and/or the third set of interconnects 1110. Specifically, stage 6 illustrates the front sides (active sides) of the first die 1120 and the second die 1130 are coupled to the third dielectric layer 1107 and/or the third set of interconnects 1110.

The first die 1120 includes a first set of interconnects 1122 (e.g., bumps, copper pillar, copper pads). The second die 1130 includes a second set of interconnects 1132 (e.g., bumps, copper pillar, copper pads). As shown at stage 6, the first set of interconnects 1122 of the first die 1120 is coupled to the third set of interconnects 1110. Similarly, the second set of interconnects 1132 of the second die 1130 is coupled to the third set of interconnects 1110. In some implementations, a copper-copper or oxide-oxide/copper-copper hybrid bond may be used for the joint between the interconnect 1110 and the interconnects 1122 and/or 1132.

Stage 6 also illustrates that the first die 1120 and the second die 1132 are electrically coupled together though a set of interconnect 1124. In some implementations, the set of interconnects 1124 are a subset of interconnects from the first set of interconnects 1106. In some implementations, the set of interconnects 1124 are high density interconnects comprising a pitch of about 4 microns (μm) or less.

Stage 6 further illustrates that an underfill 1126 is provided (e.g., formed). In some implementations, the underfill 1126 is provided such that the underfill 1126 covers the first set of interconnects 1122 and/or the second set of interconnects 1132. In some implementations, providing the underfill 1126 is optional. Different implementations may use different processes (e.g., capillary or pre-applied) for providing the underfill 1126.

Stage 7 illustrates a state after an encapsulation material 1140 is provided (e.g., formed). The encapsulation material 1140 substantially or completely surrounds or encapsulates the first die 1120 and the second die 1130. Different implementations may use different materials for the encapsulation material 1140, such as mold and/or epoxy. It should be noted that in some implementations, a set of interconnects (e.g., solder balls or metal posts/pillars) may be provided (e.g., formed) before providing the encapsulation material.

Stage 8 illustrates a state after one or more cavities 1142 are formed in the encapsulation material 1140. In some implementation, a laser process (e.g., using a laser to drill) to form cavities in the encapsulation material 1140. It should be noted that the shape of the cavities 1142 is merely exemplary. Different implementations may use different shapes for the cavity 1142. In some implementations, after stage 8, portions of the encapsulation material 1140 may be optionally removed to thin the encapsulation material 1140 or to expose the dies 1120 and/or 1130.

Stage 9 illustrates a state after one or more cavities 1142 are filled with a conductive material to form a set of interconnects 1144. In some implementations, the set of interconnects 1144 are formed with copper or a solder. As mentioned above, in some implementations, the set of interconnects 1144 are provided (e.g., formed) before the encapsulation material 1140 (e.g., encapsulation layer) is provided. In some implementations, after stage 9, portions of the encapsulation material 1140 may be optionally removed to thin the encapsulation material 1140 or to expose the dies 1120 and/or 1130.

Figure 11C:
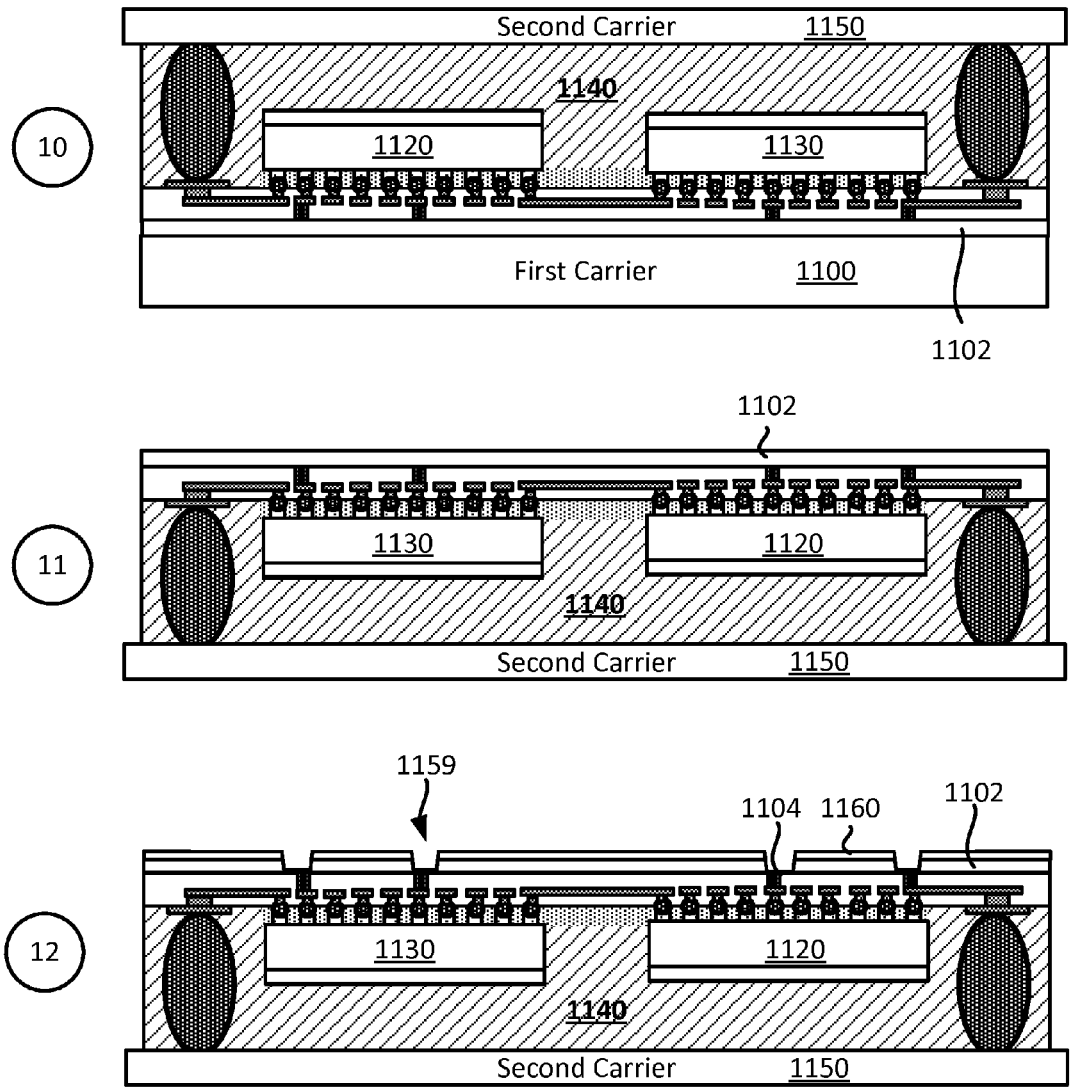

Stage 10 of FIG. 11C illustrates a state a second carrier 1150 is provided (e.g., formed) on the encapsulation material 1140. In some implementations, the second carrier 1150 is bonded using a bonding agent (e.g., glue) to the encapsulation material 1140. In some implementations, the second carrier 1150 is a bonding tape. In some implementations, the second carrier 1150 is a substrate and/or wafer.

Stage 11 illustrates a state after the first carrier 1100 is removed. In some implementations, removing the first carrier 1100 includes grinding, etching and/or polishing the first carrier 1100. In one example, if the carrier 1100 is a silicon (Si) carrier, the carrier 1110 is grinded to a small thickness and then a chemical is used (such as TMAH, KOH) to remove all of the silicon carrier up to the dielectric layer 1102, which may include (SiO2, SiN or SiC etc). In some implementations, some or all of the dielectric layer 1102 may be removed as well.

Stage 12 illustrates a state after a dielectric layer 1160 is provided (e.g., formed, patterned) on the remaining surface of the dielectric layer 1102. In some implementations, the dielectric layer 1160 is an organic layer. Stage 12 also illustrates a state after one or more cavities 1159 are etched in the dielectric layer 1102 and/or 1160. In some implementations, as SAP process, as described in FIGS. 7-8 may be used to form one or more cavities.

Figure 11D:
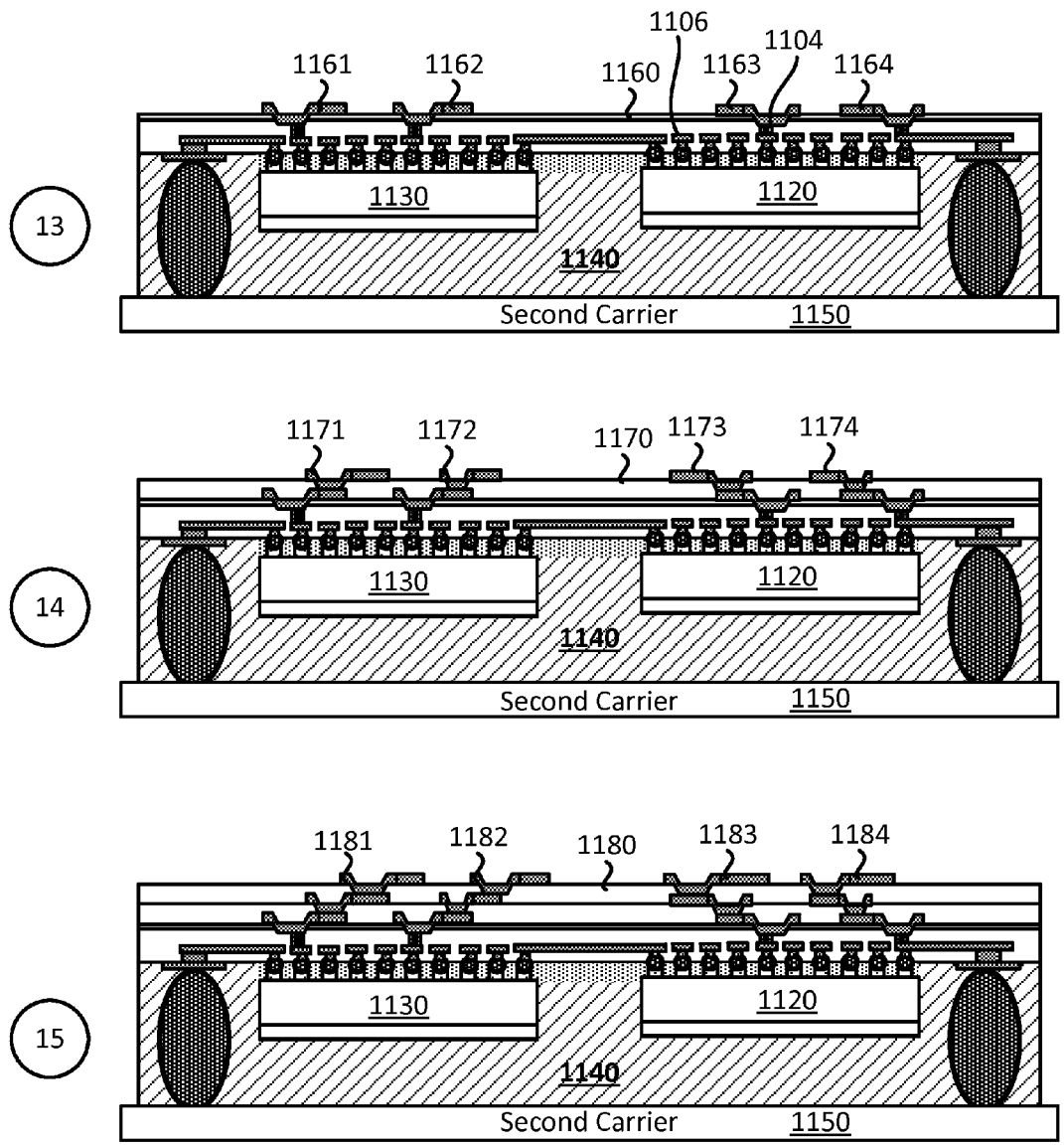

Stage 13 as shown in FIG. 11D, illustrates a state after several first redistribution interconnects 1161-1164 are formed in the dielectric layer 1160. In some implementations, one or more the first redistribution interconnects 1161-1164 includes a first metal layer (e.g., seed layer) and a second metal layer. In some implementations, one or more of the first redistribution interconnects 1161-1164 is formed using the semi-additive patterning (SAP) described and illustrated in FIGS. 7-8. As mentioned above at stage 3, in some implementations, the first set of interconnects 1104 is optional. That is the second set of interconnects 1106 is formed but the first set of interconnects 1104 is not. In such instances, the first redistribution interconnects 1161-1164 is coupled (e.g., directly coupled) to the second set of interconnects 1106 instead of being coupled to the first set of interconnects 1104.

Stage 14 illustrates a state after a dielectric layer 1170 and several second redistribution interconnects 1171-1174 are formed in the dielectric layer 1170. In some implementations, one or more the second redistribution interconnects 1171-1174 includes a first metal layer (e.g., seed layer) and a second metal layer. In some implementations, one or more of the second redistribution interconnects 1171-1174 is formed using the semi-additive patterning (SAP) described and illustrated in FIGS. 7-8.

Stage 15 illustrates a state after a dielectric layer 1180 and several third redistribution interconnects 1181-1184 are formed in the dielectric layer 1180. In some implementations, one or more the third redistribution interconnects 1181-1184 includes a first metal layer (e.g., seed layer) and a second metal layer. In some implementations, one or more of the third redistribution interconnects 1181-1184 is formed using the semi-additive patterning (SAP) described and illustrated in FIGS. 7-8.

Figure 11E:
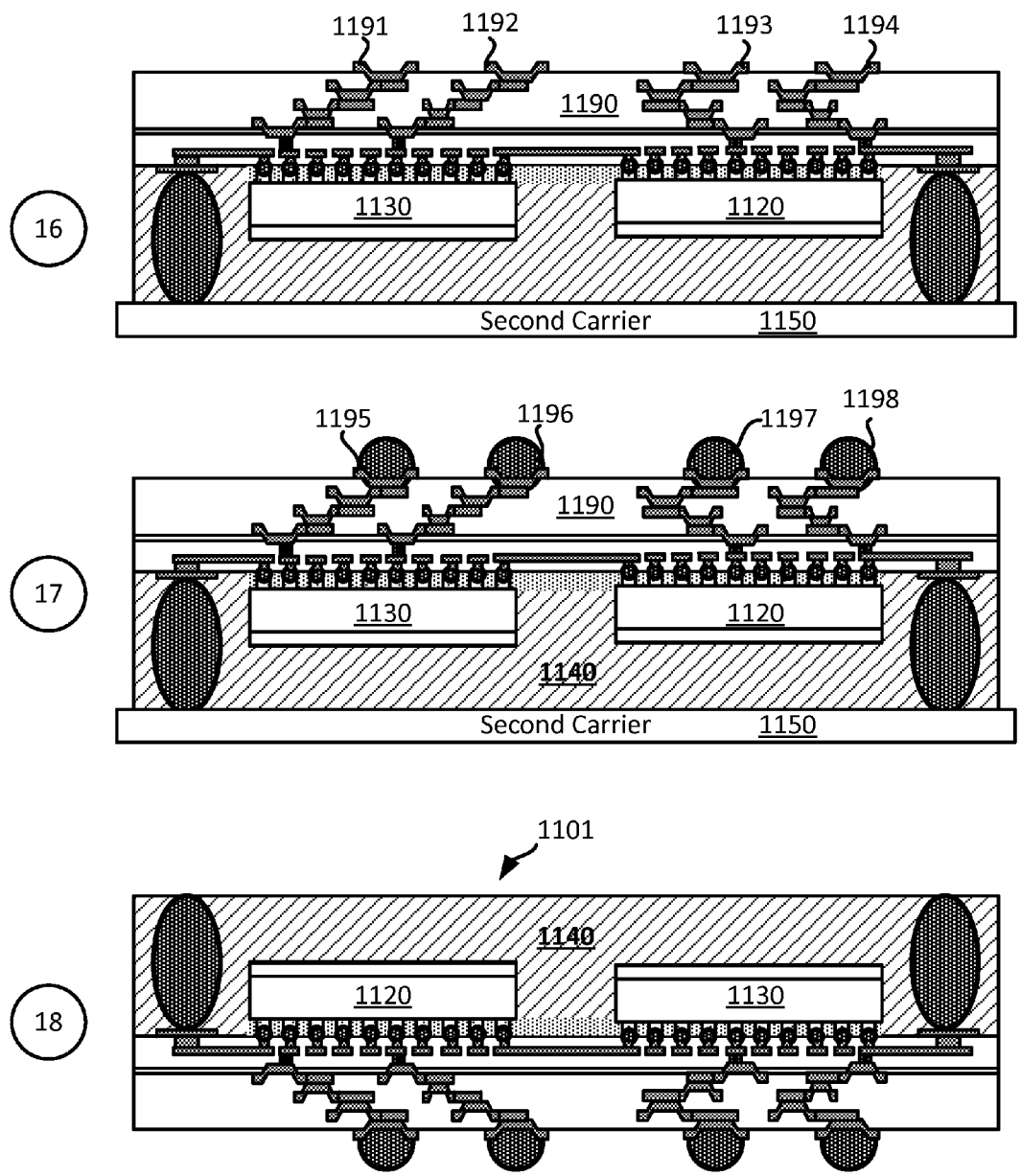

Stage 16 as shown in FIG. 11E, illustrates a state after at least one under bump metallization (UBM) layer is provided. Specifically, stage 16 illustrates a state after a first under bump metallization (UBM) layer 1191, a second UBM layer 1192, a third UBM layer 1193, and a fourth UBM layer 1194 are provided. The UBM layers are provided on the dielectric layer 1190. Stage 11 illustrates the set of dielectric layers 1190. In some implementations, the set of dielectric layers 1190 includes the dielectric layers 1160, 1170, and 1180. In some implementations, the solder ball may be coupled to the redistribution interconnects instead of a UBM layer. In some implementations, providing the UBM layer is optional.

Stage 17 illustrates a state after at least one solder ball is provided on the UBM layer. Specifically, a first solder ball 1195 is coupled to the first UBM layer 1191, a second solder ball 1196 is coupled to the second UBM layer 1192, a third solder ball 1197 is coupled to the third UBM layer 1193, and a fourth solder ball 1198 is coupled to the fourth UBM layer 1194.

Stage 18 illustrates a state after the second carrier 1150 is removed (e.g., polished). As shown at Stage 18, at least a portion of the carrier 1150 is removed (e.g., entire carrier 1150 is removed). In some implementations, at least a portion of the encapsulation material 1140 is also removed.

Exemplary Integrated Device that High Density Inter-Die Interconnects in Hybrid Substrate Comprising Organic and Inorganic Dielectric Layers FIG. 12 conceptually illustrates another example of a side view of an integrated device (e.g., semiconductor device, integrated package) that includes several dies that are exposed (e.g., portions of side are free of encapsulation). Specifically, FIG. 12 illustrates an integrated device 1200 (e.g., integrated package) that includes a first dielectric layer 1202, a second dielectric layer 1203, a first set of solder balls 1204, a first die 1206, a second die 1208, an encapsulation material 1220, and an underfill 1222.

FIG. 12 is similar to FIG. 2, except that FIG. 12 has one or more dies that are exposed. That is, some portions (e.g., top side) of the dies are free of the encapsulation material 1220. In some implementations, this configuration allows for better thermal and/or heat dissipation of the integrated device. In some implementations, the encapsulation material 1220 may be provided such that it does not cover the top side of the dies 1206 and/or 1208. In some implementations, the encapsulation material 1220 may be provided such that it covers the dies. In such instances, portions of the encapsulation material 1220 may be removed (e.g., grinded off) to expose the dies 1206 and/or 1208. Different implementations may remove the encapsulation material 1220 differently (e.g., during different stages of a fabrication process). Referring back to FIGS. 11A-11E, in some implementations, portions of the encapsulation material 1220 may be removed after Stage 8 or 9 of the sequence shown in FIGS. 11A-11E. In some implementations, portions of the encapsulation material 1220 may be removed after Stage 18.

Different implementations may use different materials for the encapsulation material 1220. For example, the encapsulation material 1220 may include one of at least a mold, an epoxy and/or a polymer fill. The package interconnect 1270 and the pad 1272 are located within the encapsulation material 1220. FIG. 12 illustrates that the package interconnect 1270 is a solder ball. However, in some implementations, the package interconnect 1270 may be another interconnect.

The first dielectric layer 1202 is different than the second dielectric layer 1203. The first dielectric layer 1202 is an organic dielectric layer. The second dielectric layer 1203 is an inorganic dielectric layer. In some implementations, the first dielectric layer 1202 includes several organic dielectric layers. In some implementations, an organic dielectric layer may include one of at least polyimide, Polybenzoxazole (PBO) and/or a polymer layer. In some implementations, the second dielectric layer 1203 includes several inorganic dielectric layers. In some implementations, an inorganic dielectric layer may include one of at least, silicon oxide, silicon nitride, silicon carbon, carbon comprising a SiN SiO2 film. In some implementations, the second dielectric layer 1203 is a polymer film.

FIG. 12 illustrates that the first dielectric layer 1202 includes a set of metal layers. In particular, the first dielectric layer 1202 includes a first set of redistribution interconnects 1230, a first under bump (UBM) layer 1232, a second set of redistribution interconnects 1240, a second under bump (UBM) layer 1242, a third set of redistribution interconnects 1250, a third under bump (UBM) layer 1252, a fourth set of redistribution interconnects 1260, and a fourth under bump (UBM) layer 1262. In some implementations, the first, second, third, and fourth redistribution interconnects 1230, 1240, 1250, and 1260 are redistribution layers in the dielectric layer 1202. The redistribution layers may include vias. Different implementations may have different number of redistribution metal layers (e.g., 1, 2 or more metal layers). In some implementations, a portion of the first redistribution layers 1230 may be embedded into the second dielectric layer 1203 for electrical connection.

In some implementations, the metal layers in the first dielectric layer 1202 are fabricated using semi-additive patterning (SAP) process. An example of a SAP process is further described in FIGS. 7-8. In some implementations, one result of using a SAP process is that at least one redistribution layer has two metal layers, a first seed metal layer and a second metal layer. In some implementations, the first seed metal layer is formed along only the base portion of the redistribution layers.

FIG. 12 also illustrates that the second dielectric layer 1203 includes a set of metal layers. In some implementations, the set of metal layers in the second dielectric layer 1203 are interconnects that have higher density (e.g., lower pitch) than the metal layers in the first dielectric layer 1202. In particular, the second dielectric layer 1203 includes a first set of high density interconnects 1280, a second set of high density interconnects 1282, and a third set of high density interconnects 1284. In some implementations, the third set of high density interconnects 1284 may be via structures. In some implementations, the third set of high density interconnects 1284 may be optional. The first set of high density interconnects 1280 are inter-die interconnects that electrically couple the first die 1206 and the second die 1208. The second set of high density interconnects 1282 are interconnects that electrically couple to metal layers in the first dielectric layer 1202. For example, the second set of high density interconnects 1282 electrically couple to one of the redistribution metal layers in the first dielectric layer 1202. The second set of high density interconnects 1282 are interconnects that electrically couple to a package interconnect 1270 through a pad 1272. In some implementations, at least some of the set of metal layers in the second dielectric layer 1203 have a pitch of about 4 microns (μm) or less.

In some implementations, the metal layers in the second dielectric layer 1203 are fabricated using a damascene process. An example of a damascene process is further described in FIGS. 9-10. In some implementations, one result of using a damascene process is that at least one interconnect has a first metal layer, and an optional second metal layer.

The dies (e.g., first die 1206, second die 1208) may represent different types of dies, such as memory dies, and/or processors. In some implementations, the first die 1206 and/or the second die 1208 are wafer level dies.

The first die 1206 is coupled to a first surface of the dielectric layer 1202 through the first set of interconnects 1216. In some implementations, the first set of interconnects 1216 are metal pillars (e.g., metal layers). In some implementations, the metal pillars are copper pillars. The first set of interconnects 1216 may or may not include solder balls. In some implementations, the first die 1206 is electrically coupled to at least one of the set of solder balls 1204 through the first set of interconnects 1216, the first set of redistribution interconnects 1230, the first UBM layer 1232, the second set of redistribution interconnects 1240, and/or the second UBM layer 1242. In some implementations, the interconnects (e.g., interconnects 1216) may be metal pads such that no underfill 1222 is required.

The second die 1208 is coupled to the first surface of the dielectric layer 1202 through the second set of interconnects 1218. In some implementations, the second set of interconnects 1218 are metal pillars (e.g., metal layers). In some implementations, the metal pillars are copper pillars. The second set of interconnects 1218 may or may not include solder balls. In some implementations, the second die 1208 is electrically coupled to at least one of the set of solder balls 1204 through the second set of interconnects 1218, the third set of redistribution interconnects 1250, and/or the third UBM layer 1252.

FIG. 12 illustrates that the first set of interconnects 1216 and the second set of interconnects 1218 are encapsulated by the underfill 1222. The underfill 1222 is optional in some instances.

Exemplary Method for Providing/Fabricating an Integrated Device that High Density Inter-Die Interconnects in Hybrid Substrate Comprising Organic and Inorganic Dielectric Layers In some implementations, fabricating an integrated device (e.g., integrated package) and/or substrate includes several processes. FIG. 13 illustrates an exemplary flow diagram of a method for providing an integrated device. In some implementations, the method of FIG. 13 may be used to provide/manufacture the integrated device of FIG. 2, and/or other integrated devices described in the present disclose.

It should be noted that the flow diagram of FIG. 13 may combine one or more steps and/or processes in order to simplify and/or clarify the sequence for providing/fabricating an integrated device that includes several dies.

In some implementations, the flow diagram of FIG. 13 illustrates a novel method/process that provides an integrated device with high density interconnects (e.g., pitch between interconnects is about 4 microns or less) and/or an integrated device that bypasses the use of unnecessary big landing pads (e.g., big bump pads).

The method provides (at 1305) a first carrier. In some implementations, the first carrier is a substrate and/or a wafer. Different implementations may use different materials for the carrier (e.g., silicon substrate, glass substrate, ceramic substrate).

The method provides (at 1310) a first set of interconnects using a first process. The first set of interconnects includes a first density. In some implementations, providing (e.g., forming) the first set of interconnects includes providing a first dielectric layer on a first surface (e.g., top surface) of the first carrier. Different implementations may use different materials for the first dielectric layer. For example, in some implementations, the first dielectric layer is one of at least an inorganic dielectric layer (e.g., inorganic film, SiO2, SiN, SiC or combination thereof). In some implementations, providing the first set of interconnects includes providing (e.g., forming) a second dielectric layer and the first set of interconnects (e.g., interconnects 1104, 1106). In some implementations, the second dielectric layer is an inorganic dielectric layer. The first set of interconnects may includes high density vias (e.g., via that have diameters of about 2 microns (μm) or less), and/or high density traces (e.g., traces that have a pitch of about 4 microns (μm) or less). Stage 3 of FIG. 11A illustrates an example of a state after providing a first set of interconnects. In some implementations, one or more of the first set of interconnects include a first metal layer (e.g. seed layer) and a second metal layer, as shown and described in FIGS. 4 and/or 9. In some implementations, the first set of interconnects are formed by using the process (e.g., damascene process) described and illustrated in FIGS. 9-10. In some implementations, additional interconnects and dielectrics may be provided (e.g., formed) and coupled to the first set of interconnects. In some implementations, one or more of these additional interconnects may include a first metal layer (e.g. seed layer) and a second metal layer, as shown and described in FIGS. 3 and/or 7. In some implementations, one or more of these additional interconnects may include a first metal layer (e.g. seed layer) and a second metal layer, as shown and described in FIGS. 4 and/or 9.

The method provides and couples (at 1315) at least one integrated device (e.g., first die) to the first set of interconnects. For example, front sides (active sides) of a first die and a second die may be coupled to the first set of interconnects. In some implementations, coupling the integrated device to the first set of interconnects may includes providing (e.g., forming) an underfill between the integrated device and the first set of interconnects. In some implementations, the underfill is provided such that the underfill covers the first set of interconnects. In some implementations, providing the underfill is optional. Different implementations may use different processes (e.g., capillary or pre-applied) for providing the underfill.

The method provides (at 1320) an encapsulation layer (e.g., mold) on the integrated device. The encapsulation layer substantially or completely surrounds or encapsulates the integrated device. Different implementations may use different materials for the encapsulation layer, such as mold and/or epoxy. It should be noted that in some implementations, a set of interconnects (e.g., solder balls or metal posts/pillars) may be provided (e.g., formed) before providing the encapsulation material.

The method provides (at 1325) a set of through encapsulation interconnects (e.g., through encapsulation vias). In some implementations, providing the set of through encapsulation interconnects includes providing (e.g., forming) a set of cavities in the encapsulation layer, and filling (e.g., plating) the cavities with a conducting material. In some implementation, a laser process (e.g., using a laser to drill) to form cavities in the encapsulation layer. In some implementations, the set of interconnects in the cavities are formed with copper or a solder. As mentioned above, in some implementations, the set of interconnects are provided (e.g., formed) before the encapsulation layer is provided. In some implementations, portions of the encapsulation layer may be optionally removed to thin the encapsulation layer or to expose the integrated devices in the encapsulation layer.

The method provides (at 1330) a second carrier on the encapsulation layer. In some implementations, the second carrier is coupled (e.g., bonded) to the encapsulation layer using a bonding agent (e.g., glue). In some implementations, the second carrier is a bonding tape. In some implementations, the second carrier is a substrate and/or wafer.

The method then removes (at 1335) the first carrier is removed. In some implementations, removing the first carrier includes grinding, etching and/or polishing the first carrier. In one example, if the carrier is a silicon (Si) carrier, the carrier is grinded to a small thickness and then a chemical is used (such as TMAH, KOH) to remove all of the silicon carrier up to the dielectric layer 1102, which may include (SiO2, SiN or SiC etc). In some implementations, some or all of the dielectric layer coupled to the first carrier may be removed as well.

The method provides (at 1340) a second set of interconnects using a second process. The second set of interconnects includes a second density. In some implementations, providing (e.g., forming) the second set of interconnects includes provides one or more dielectric layers and one or more interconnects. In some implementations, the dielectric layer is an organic layer. In some implementations, the second set of interconnects redistribution interconnects. In some implementations, one or more the redistribution interconnects include a first metal layer (e.g., seed layer) and a second metal layer. In some implementations, one or more of the first redistribution interconnects are formed using the semi-additive patterning (SAP) described and illustrated in FIGS. 7-8.

In some implementations, providing (at 1340) the second set of interconnects includes providing at least one under bump metallization (UBM) layer. In some implementations, a solder ball may be coupled to the redistribution interconnects and/or a UBM layer. In some implementations, providing the UBM layer is optional.

The method removes (at 1345) the second carrier. In some implementations, removing the second carrier includes polishing and/or grinding the second carrier. In some implementations, at least a portion of the encapsulation layer is also removed.

Exemplary Sequence for Providing/Fabricating Redistribution Layers

In some implementations, providing an integrated device that includes redistribution layers includes several processes. FIG. 14 (comprising FIGS. 14A-14C) illustrates an exemplary sequence for providing an integrated device (e.g., die) that includes several redistribution layers. In some implementations, the sequence of FIGS. 14A-14C may be used to provide/fabricate the integrated device and/or redistribution layers of FIGS. 2, 3, 5-6 and/or other integrated devices (e.g., dies) and/or redistribution layers described in the present disclose. It should also be noted that the sequence of FIGS. 14A-14C may be used to provide/manufacture integrated devices that also include circuit elements. It should further be noted that the sequence of FIGS. 14A-14C may combine one or more stages in order to simplify and/or clarify the sequence for providing an integrated device that includes redistribution layers.

As shown in stage 1 of FIG. 14A, a substrate (e.g., substrate 1401) is provided. In some implementations, the substrate 1401 is a wafer. Different implementations may use different materials for the substrate (e.g., silicon substrate, glass substrate, ceramic substrate).

In addition, at stage 1, several lower level metal layers and dielectric layers (e.g., lower level metal and dielectric layers 1402) are provided on the substrate 1401. Different implementations may provide different number of lower level metal layers and dielectric layers (e.g., M1 metal layer, M2 metal layer, M3 metal layer, M4 metal layer, M5 metal layer, M6 metal layer, M7 metal layer).

In some implementations, circuits, routes and/or interconnects are also provided. However, for the purpose of simplification and clarity, circuits, routes and/or interconnects are not shown in the lower level metal layers and dielectric layers 1402.

Moreover, at stage 1, at least one pad (e.g., pads 1404, 1425, 1429) is provided on the lower level metal layers and dielectric layers 1402. In some implementations, the pad 1404 is coupled to one of the lower level metal layer (e.g., the top lower level metal layer, M7 metal layer). In some implementations, the pad 1404 is an aluminum pad. However, different implementations may use different materials for the pad 1404. Different implementations may use different processes for providing the pad on the lower level metal layers and dielectric layers 1402. For example, in some implementations, a lithography and/or etching process may be use to provide the pad 1404 on the lower level metal layers and dielectric layers 1402.

Additionally, at stage 1, a passivation layer (e.g., passivation layer 1406) is provided on the lower level metal layers and dielectric layers 1402. Different implementations may use different materials for the passivation layer 1406. As shown in stage 4, the passivation layer 1406 is provided on the lower level metal layers and dielectric layers 1402 such that at least a portion of the pad 1404 is exposed. It should be noted that instead of lower level metal layers, in some implementations, other metal layers may be provided. For example, metal layers defined by a damascene process may be provided at stage 1.

At stage 2, a first insulation layer (e.g., first insulation layer 1408) is provided on the passivation layer 1406 and the pads 1404, 1425 and 1429. In some implementations, the first insulation layer 1408 is a dielectric layer. Different implementations may use different materials for the first insulation layer 1408. For example, the first insulation layer 1408 may be a Polybenzoxazole (PbO) layer or a polymer layer.

At stage 3, several cavities (e.g., cavity, trench) is provided/created in the first insulation layer 1408. As further shown in stage 3, the cavity 1409 is created over the pad 1404. Similarly, a cavity 1411 is created over the pad 1425, and a cavity 1413 is created over the pad 1429. Different implementations may create the cavities (e.g., cavity 1009) differently. For example, the cavity 1409 may be provided/created by etching the first insulation layer 1408.

At stage 4 of FIG. 14B, a first metal redistribution layer is provided. Specifically, a first metal redistribution layer 1410 is provided over the pad 1404 and the first insulation layer 1408. As shown in stage 4, the first metal redistribution layer 1410 is coupled to the pad 1404. The first metal redistribution layer 1410 also includes a first metal layer 1430 and a second metal layer 1432. That is, in some implementations, the first metal layer 1430 and the second metal layer 1432 is on the same layer as the first metal redistribution layer 1410. In some implementations, the first and second metal layers 1420 and 1430 are vias. In some implementations, the first metal redistribution layer 1410 is a copper layer. For the purposes of clarity the metal layers 1410, 1420 and 1430 are shown as one layers. However, in some implementations, one or more of the metal layers 1410, 1420 and/or 1430 may include two metal layers, a first metal layer (e.g., seed layer) and a second metal layer. An example of a redistribution layer that includes a seed layer was described in FIGS. 3, 5, 6, 7 and 8. Similarly, for the purpose of clarity, the other redistribution layers described in the present FIGS. 14B-14C are illustrated as one metal layer, but may include two metal layers (e.g., first seed layer, and a second metal layer) in some implementations.

At stage 5, several insulation layers and several redistribution layers are provided. Specifically, a second insulation layer 1414 and a third insulation layer 1416 are provided. Moreover, a second metal redistribution layer 1420 is provided. In addition, several metal layers (1240, 1450, 1442, 1452) are provided. In some implementations, the metal layers are part of the redistribution layers. In some implementations, some of the metal layers include vias. For example, metal layers 1442, and 1452 are vias and metal layers 1440 and 1450, are traces in some implementations.

At stage 6, a cavity 1417 is provided in the insulation layer 1416. The cavity 1417 in the insulation layer 1416 is over a portion of the interconnect 1420.

At stage 7 of FIG. 14C, an under bump metallization (UBM) layer is provided. Specifically, an under bump metallization (UBM) layer 1470 is provided in the cavity 1417 of the insulation layer 1416. In some implementations, the UBM layer 1470 is a copper layer.

At stage 8, a solder ball is provided on the UBM layer. Specifically, a solder ball 1480 is coupled to the UBM layer 1470.

Exemplary Electronic Devices

FIG. 15 illustrates various electronic devices that may be integrated with any of the aforementioned integrated device, semiconductor device, integrated circuit, die, interposer or package. For example, a mobile telephone 1502, a laptop computer 1504, and a fixed location terminal 1506 may include an integrated device 1500 as described herein. The integrated device 1500 may be, for example, any of the integrated circuits, substrates, dies, package or package-on-package (PoP) devices described herein. The devices 1502, 1504, 1506 illustrated in FIG. 15 are merely exemplary. Other electronic devices may also feature the integrated device 1500 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11A-11E, 12, 13, 14A-14C and/or 15 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11A-11E, 12, 13, 14A-14C and/or 15 and its corresponding description in the present disclosure is not limited to dies and/or ICs. In some implementations, FIGS. 2, 3, 4, 5, 6, 7, 8, 9, 10, 11A-11E, 12, 13, 14A-14C and/or 15 and its corresponding description may be used to manufacture, create, provide, and/or produce integrated devices. In some implementations, an integrated device may include a die package, an integrated circuit (IC), a wafer, a semiconductor device, a substrate and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a base portion for the integrated device, the base portion comprising:
   a first inorganic dielectric layer;
   a first set of interconnects in the first inorganic dielectric layer, wherein the first set of interconnects comprises a first interconnect comprising:
   a first seed layer; and
   a first metal layer coupled to the first seed layer;
   a second dielectric layer different from the first inorganic dielectric layer; and
   a second set of interconnects in the second dielectric layer, the second set of interconnects comprising a second interconnect, wherein the second interconnect comprises:
   a second seed layer; and
   a second metal layer coupled to the second seed layer, wherein the second interconnect is coupled to the first interconnect such that the second seed layer is directly coupled to the first seed layer;
   a first die coupled to a first surface of the base portion; and
   a second die coupled to the first surface of the base portion, the second die is configured to electrically couple to the first die through the first set of interconnects.

2. The integrated device of claim 1, wherein the second dielectric layer is an organic dielectric layer.

3. The integrated device of claim 1, wherein the first set of interconnects comprises a first spacing that is less than a second spacing of the second set of interconnects.

4. The integrated device of claim 1, wherein the first set of interconnects comprises a first pitch that is about 4 microns (μm) or less.

5. The integrated device of claim 1, wherein the first seed layer is coupled to a horizontal portion of the first metal layer and side portions of the first metal layer.

6. The integrated device of claim 1, wherein the second seed layer is located only on a horizontal planar surface of the first interconnects.

7. The integrated device of claim 1, wherein the second seed layer is located only on a bottom planar surface of the first set of interconnects.

8. The integrated device of claim 1, further comprising an encapsulation material that encapsulates the first die and the second die.

9. The integrated device of claim 8, further comprising a third set of interconnects traversing the encapsulation material, the third set of interconnects configured to operate as a set of package-to-package interconnects in package-on-package (PoP) device.

10. The integrated device of claim 9, wherein the third set of interconnects comprises one or more of a solder ball, or a through encapsulation via (TEV), or combinations thereof.

11. The integrated device of claim 1, wherein the first die comprises a first set of interconnect pillars, the first die being configured to electrically couple to the second set of interconnects through the first set of interconnect pillars.

12. The integrated device of claim 1, wherein the first set of interconnects in the first inorganic dielectric layer comprises a set of vias that couple to the second set of interconnects in the second dielectric layer.

13. The integrated device of claim 1, wherein the base portion is an interposer.

14. The integrated device of claim 1, further comprising a third set of interconnects that couple the first die to the base portion.

15. The integrated device of claim 14, wherein the third set of interconnects includes one or more of an under bump, a copper-copper bonding interconnect with oxide-to-oxide, or a copper-copper/Oxide-Oxide hybrid bonding, or combinations thereof.

16. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

17. The integrated device of claim 1, wherein the first set of interconnects comprises a third interconnect that includes a third metal layer and a third seed layer coupled only to a side portion of the third metal layer, and wherein the second set of interconnects comprises a fourth interconnect that includes a fourth seed layer and a fourth metal layer coupled to the fourth seed layer, and wherein the fourth interconnect is coupled to the third interconnect such that the fourth layer is directly coupled to the third metal layer.

18. A method for fabricating an integrated device, comprising:
  forming a base portion for the integrated device, wherein forming the base portion comprises:
    forming a first inorganic dielectric layer;
    forming a first set of interconnects in the first inorganic dielectric layer, wherein forming the first set of interconnects comprises forming a first interconnect that includes a first seed layer and a first metal layer;
    forming a second dielectric layer different from the first inorganic dielectric layer; and
    forming a second set of interconnects in the second dielectric layer, wherein forming the second set of interconnects comprises forming a second interconnect that includes a second seed layer and a second metal layer, such that the second seed layer is directly coupled to the first seed layer of the first interconnect;
  coupling a first die to a first surface of the base portion; and
  coupling a second die to the first surface of the base portion such that the second die is configured to electrically couple to the first die through the first set of interconnects.

19. The method of claim 18, wherein the second dielectric layer is an organic dielectric layer.

20. The method of claim 18, wherein the first set of interconnects comprises a first spacing that is less than a second spacing of the second set of interconnects.

21. The method of claim 18, wherein the first set of interconnects comprises a first pitch that is about 4 microns (µm) or less.

22. The method of claim 18, wherein the first seed layer is coupled to a horizontal portion of the first metal layer and side portions of the first metal layer.

23. The method of claim 18, wherein the second seed layer is located only on a horizontal planar surface of the first set of interconnects.

24. The method of claim 18, wherein the second seed layer is located only on a bottom planar surface of the first set of interconnects.

25. The method of claim 18, further comprising forming an encapsulation material that encapsulates the first die and the second die.

26. The method of claim 25, further comprising forming a third set of interconnects that traverses the encapsulation material, the third set of interconnects configured to operate as a set of package-to-package interconnects in package-on-package (PoP) device.

27. The method of claim 26, wherein the third set of interconnects comprises one or more of a solder ball, or a through encapsulation via (TEV), or combinations thereof.

28. The method of claim 18, wherein the first die comprises a first set of interconnect pillars, the first die being configured to electrically couple to the second set of interconnects through the first set of interconnect pillars.

29. The method of claim 18, wherein the first set of interconnects in the first inorganic dielectric layer comprises a set of vias that couple to the second set of interconnects in the second dielectric layer.

30. The method of claim 18, further comprising forming a third set of interconnects that couples the first die to the base portion.

31. The method of claim 30, wherein the third set of interconnects includes one or more of an under bump, a copper-copper bonding interconnect with oxide-to-oxide, or a copper-copper/Oxide-Oxide hybrid bonding, or combinations thereof.

32. The method of claim 18, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

33. The method of claim 18, wherein forming the first set of interconnects further comprises forming a third interconnect that includes a third metal layer and a third seed layer formed only on a side portion of the third metal layer, and wherein forming the second set of interconnects further comprises forming a fourth interconnect that includes a fourth seed layer and a fourth metal layer, such that the fourth metal layer is directly coupled to the third metal layer of the third interconnect.

* * * * *